United States Patent
Lee et al.

(10) Patent No.: US 11,450,569 B2
(45) Date of Patent: Sep. 20, 2022

(54) SEMICONDUCTOR DEVICE AND FORMING METHOD THEREOF

(71) Applicant: TAIWAN SEMICONDUCTOR MANUFACTURING CO., LTD., Hsinchu (TW)

(72) Inventors: Hsin-Yi Lee, Hsinchu (TW); Kuan-Yu Wang, Hsinchu (TW); Cheng-Lung Hung, Hsinchu (TW); Chi-On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/025,970

(22) Filed: Sep. 18, 2020

(65) Prior Publication Data
US 2022/0093468 A1    Mar. 24, 2022

(51) Int. Cl.
*H01L 21/8234* (2006.01)
*H01L 29/66* (2006.01)
*H01L 29/78* (2006.01)

(52) U.S. Cl.
CPC ........... *H01L 21/823431* (2013.01); *H01L 21/823437* (2013.01); *H01L 29/6681* (2013.01); *H01L 29/785* (2013.01); *H01L 2029/7858* (2013.01)

(58) Field of Classification Search
CPC ..... H01L 21/823431; H01L 21/823437; H01L 29/6681; H01L 29/785
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,700,064 B1* | 6/2020 | Zhang | H01L 29/78 |
| 2017/0040435 A1* | 2/2017 | Lu | H01L 29/4966 |
| 2019/0131418 A1* | 5/2019 | Ando | H01L 27/0924 |
| 2019/0385855 A1* | 12/2019 | Chien | H01L 21/3212 |
| 2021/0118883 A1* | 4/2021 | Lim | H01L 29/775 |

* cited by examiner

*Primary Examiner* — Christine A Enad
(74) *Attorney, Agent, or Firm* — Maschoff Brennan

(57) ABSTRACT

A method of forming a semiconductor device includes forming a fin structure having a stack of alternating first semiconductor layers and second semiconductor layers over a substrate, the first semiconductor layers and the second semiconductor layers having different compositions, forming a dummy gate structure across the fin structure, forming gate spacers on opposite sidewalls of the dummy gate structure, respectively, removing the dummy gate structure to form a gate trench between the gate spacers, removing portions of the first semiconductor layers in the gate trench, such that the second semiconductor layers are suspended in the gate trench to serve as nanosheets, forming a first titanium nitride layer wrapping around the nanosheets, wherein an atomic ratio of titanium to nitrogen of the first titanium nitride layer is less than 1, and forming a metal fill layer over the first titanium nitride layer.

20 Claims, 28 Drawing Sheets

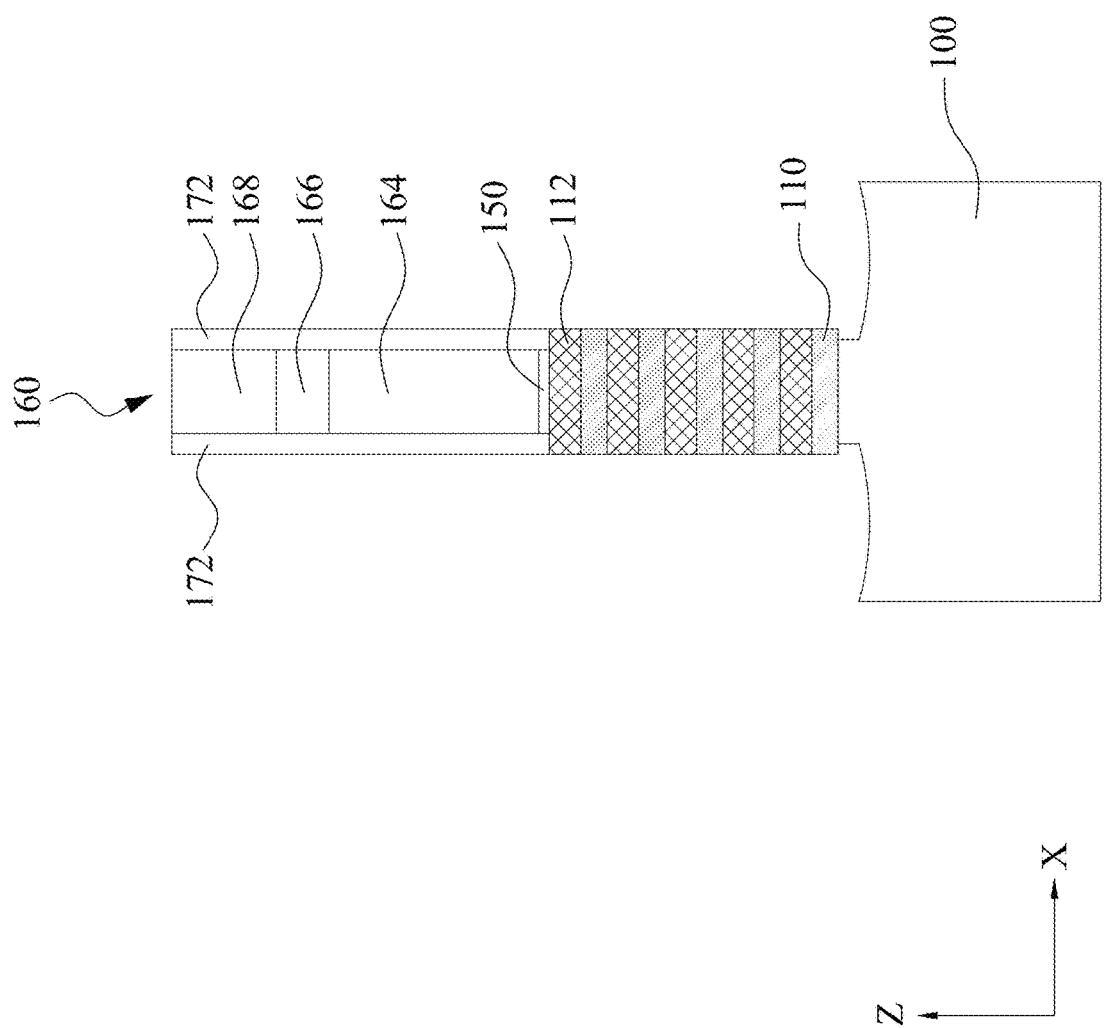

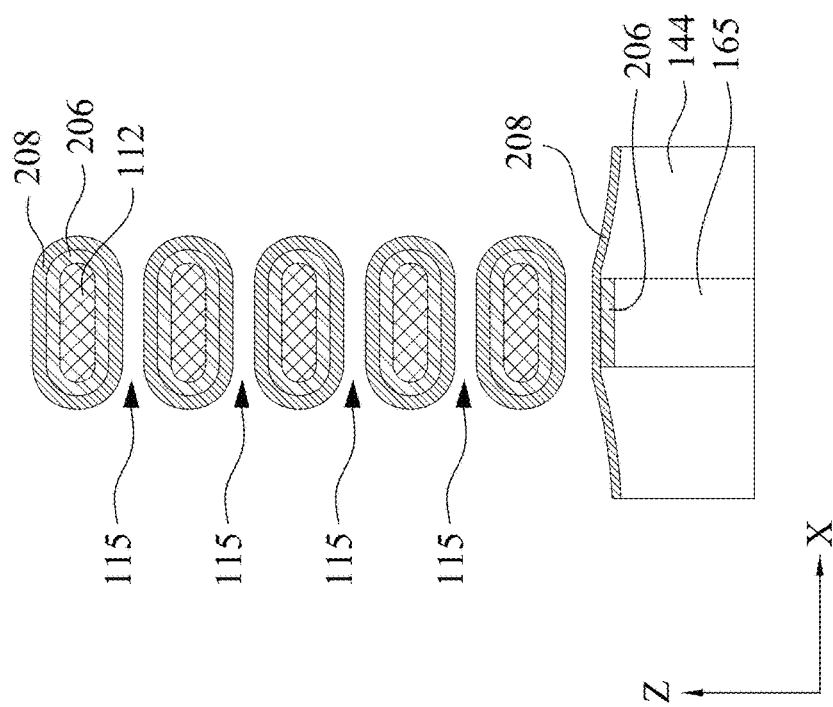
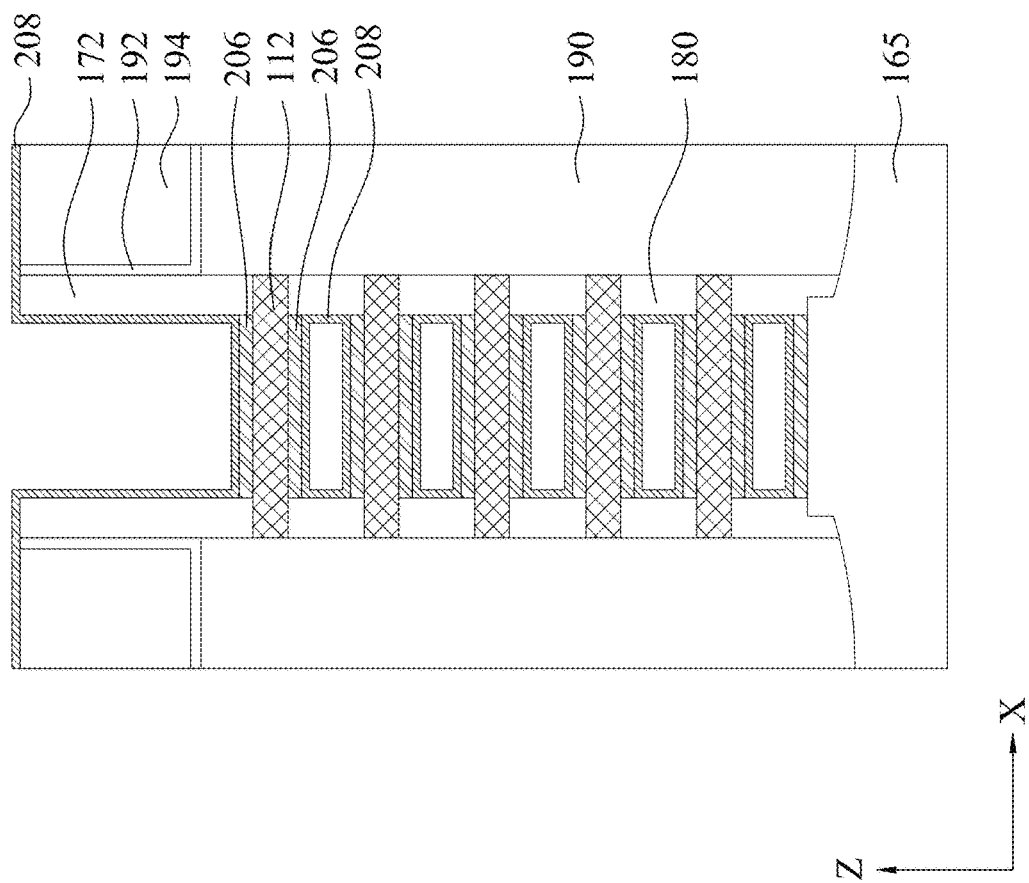
Fig. 18A
Fig. 18B

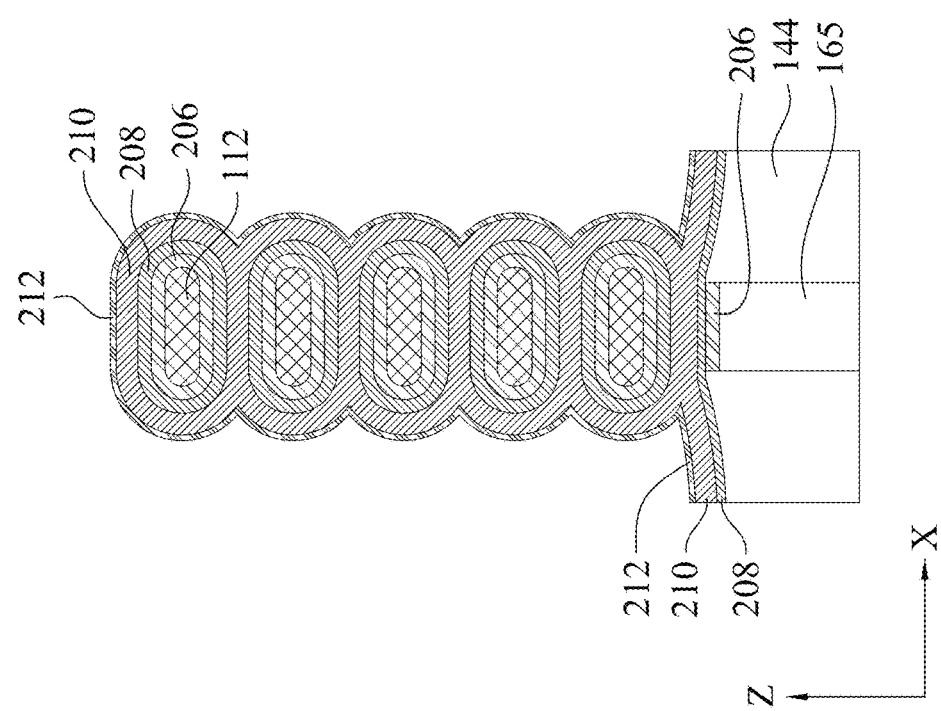
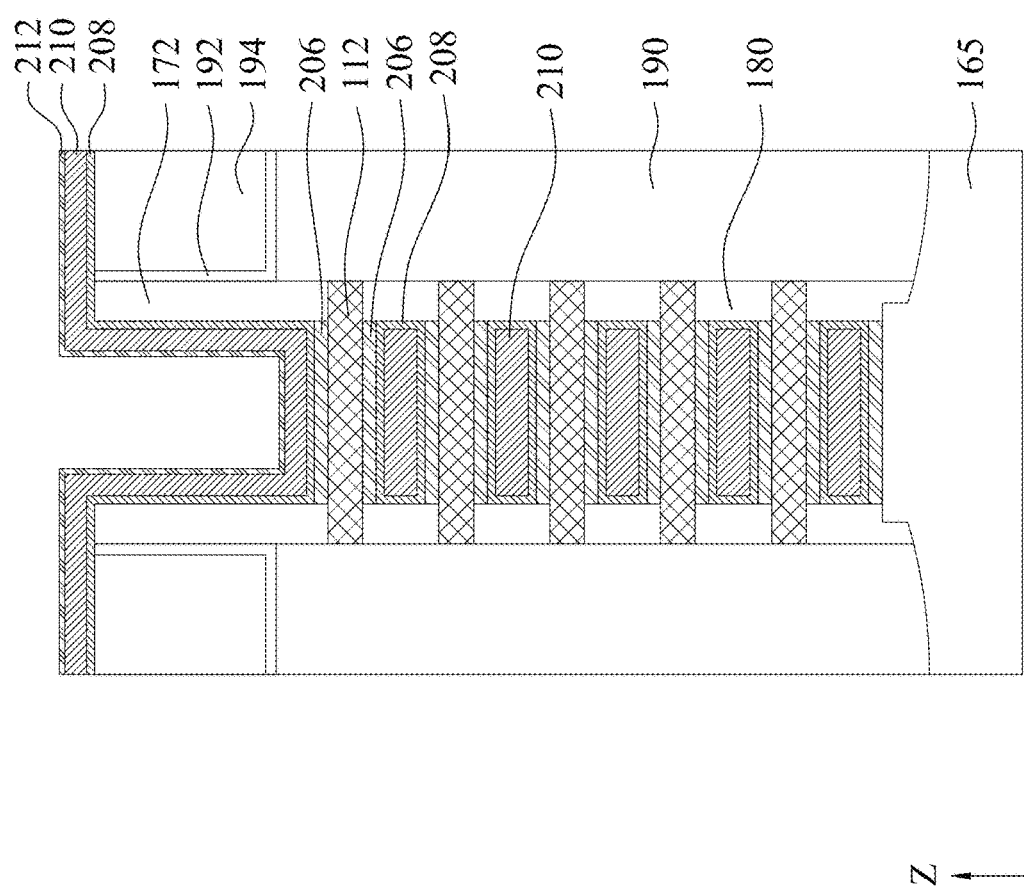
Fig. 20A
Fig. 20B

SEMICONDUCTOR DEVICE AND FORMING METHOD THEREOF

BACKGROUND

Transistors are components of modern integrated circuits. To satisfy the trend of increasingly faster speed, the drive currents of transistors need to be increasingly greater. To achieve this increase in performance, the gate lengths of transistors are scaled down. Scaling down the gate lengths leads to undesirable effects known as "short-channel effects," in which the control of current flow by the gates is compromised. Among the short-channel effects are the Drain-Induced Barrier Lowering (DIBL) and the degradation of sub-threshold slope, both of which result in the degradation in the performance of transistors.

For example, multi-gate devices have been introduced in an effort to improve gate control by increasing gate-channel coupling, reduce OFF-state current, and reduce short-channel effects (SCEs). One such multi-gate device is horizontal gate-all-around (HGAA) transistor, whose gate structure extends around its horizontal channel region providing access to the channel region on all sides or three sides. The HGAA transistors are compatible with complementary metal-oxide-semiconductor (CMOS) processes, allowing them to be aggressively scaled down while maintaining gate control and mitigating SCEs. However, fabrication of the HGAA transistors can be challenging. For example, nanosheet formation of HGAA transistors by the current methods is not satisfactory in all respects, especially when using a single process, such as a single epitaxial process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 17A to FIG. 21B are various cross-sectional views of a GAA device at different stages of fabrication, according to some embodiments of the disclosure.

DETAILED DESCRIPTION

Figure 1:
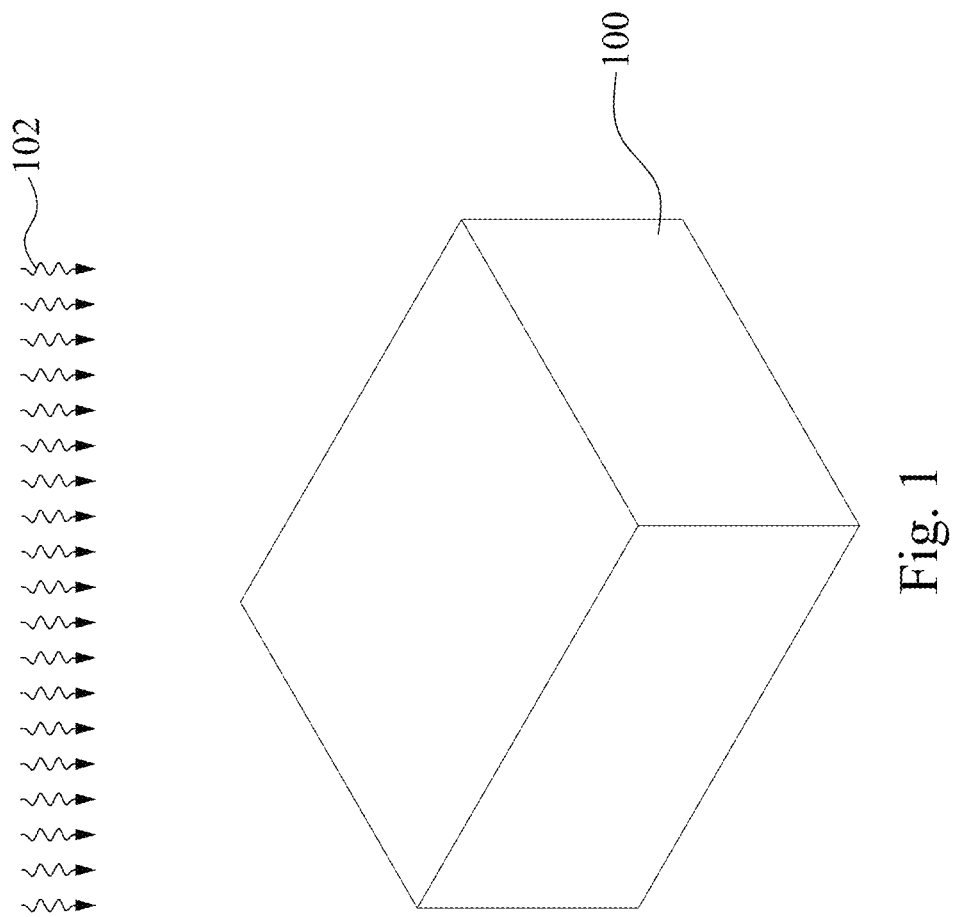
FIG. 1 to FIG. 16 are exemplary sequential processes for manufacturing the gate-all-around (GAA) FET device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In certain embodiments, the term "about" used in this context means greater or less than the stated value or the stated range of values by a percentage such as 5%, 10%, 15%, etc. of the stated values.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Reference is now made to FIG. 1 to FIG. 16, which are exemplary sequential processes for manufacturing the gate-all-around (GAA) FET device according to some embodiments of the present disclosure. It is understood that additional operations can be provided before, during, and after processes shown by FIG. 1 to FIG. 16, and some of the operations described below can be replaced or eliminated, for additional embodiments of the method. The order of the operations/processes may be interchangeable.

Referring to FIG. 1, impurity ions (dopants) 102 are implanted into a substrate 100 to form a well region. The ion implantation is performed to prevent a punch-through effect. In some embodiments, the substrate 100 may include in its surface region, one or more buffer layers (not shown). The buffer layers can serve to gradually change the lattice constant from that of the substrate to that of the source/drain regions. The substrate 100 may include various regions that have been suitably doped with impurities (e.g., p-type or n-type conductivity). The dopants 102 are, for example, phosphorus for a p-type Fin FET.

Figure 2:
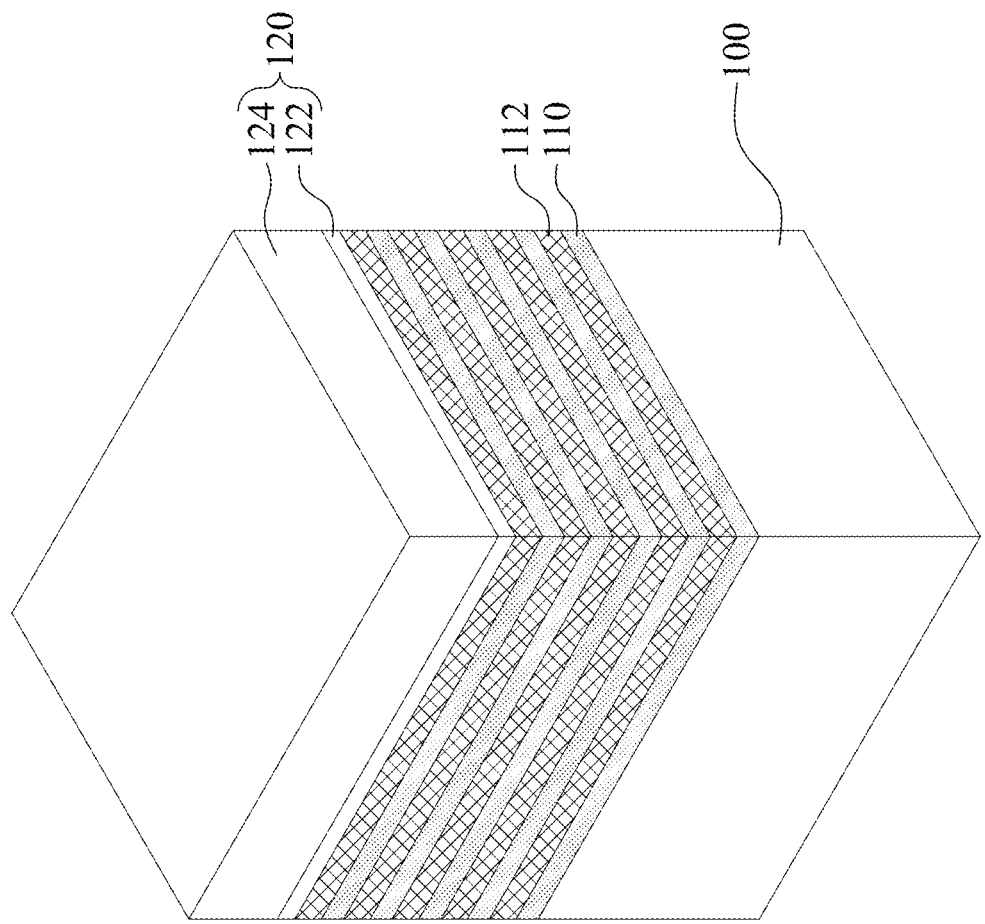

Referring to FIG. 2, stacked semiconductor layers are formed over the substrate 100. The stacked semiconductor layers include first semiconductor layers 110 and second semiconductor layers 112. Further, a mask layer 120 is formed over the stacked layers.

The first semiconductor layers 110 and the second semiconductor layers 112 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 110 and the second semiconductor layers 112 are made of Si, a Si compound, SiGe, Ge or a Ge compound. In FIG. 2, five layers of the first semiconductor layer 110 and five layers of the second semiconductor layer 112 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 110 and the second semiconductor layers 112 are epitaxially formed over the substrate 100. In some embodiments, the bottommost first semiconductor layer 110 (the closest layer to the substrate 100) is thicker than the remaining first semiconductor layers 110.

Figure 3:
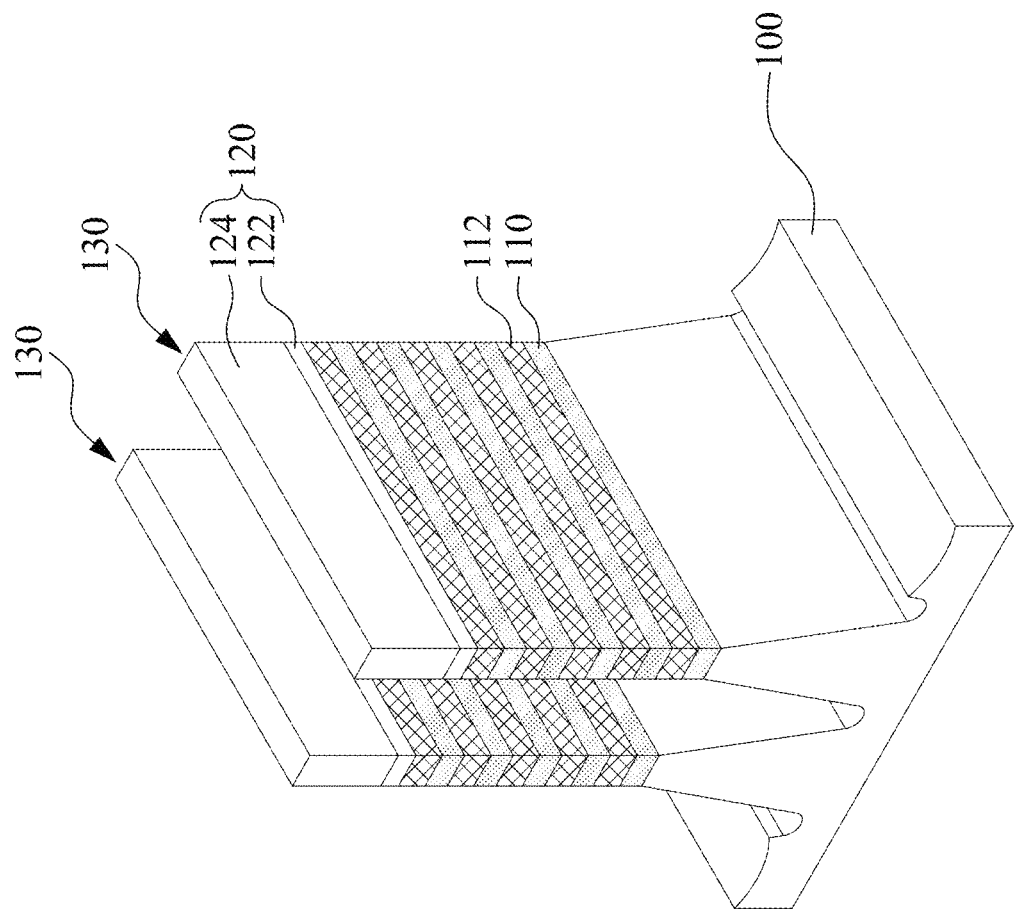
Figure 3:
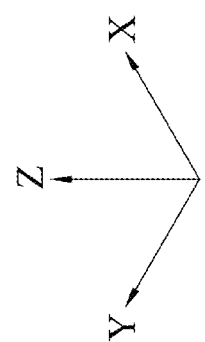

In some embodiments, the mask layer 120 includes a first mask layer 122 and a second mask layer 124. The first mask layer 122 is a pad oxide layer made of a silicon oxide, which can be formed by a thermal oxidation. The second mask layer 124 is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 120 is then patterned into a mask pattern by using patterning operations including photo-lithography and etching. Next, as shown in FIG. 3, the stacked layers of the first and second semiconductor layers 110, 112 are patterned by using the patterned mask layer, thereby the stacked layers are formed into fin structures 130 extending in the X direction. In FIG. 3, two fin structures 130 are arranged in the Y direction. But the number of the fin structures is not limited to, and may be as small as one and three or more. In some embodiments, one or more dummy fin structures are formed on both sides of the fin structures 130 to improve pattern fidelity in the patterning operations.

Figure 4:
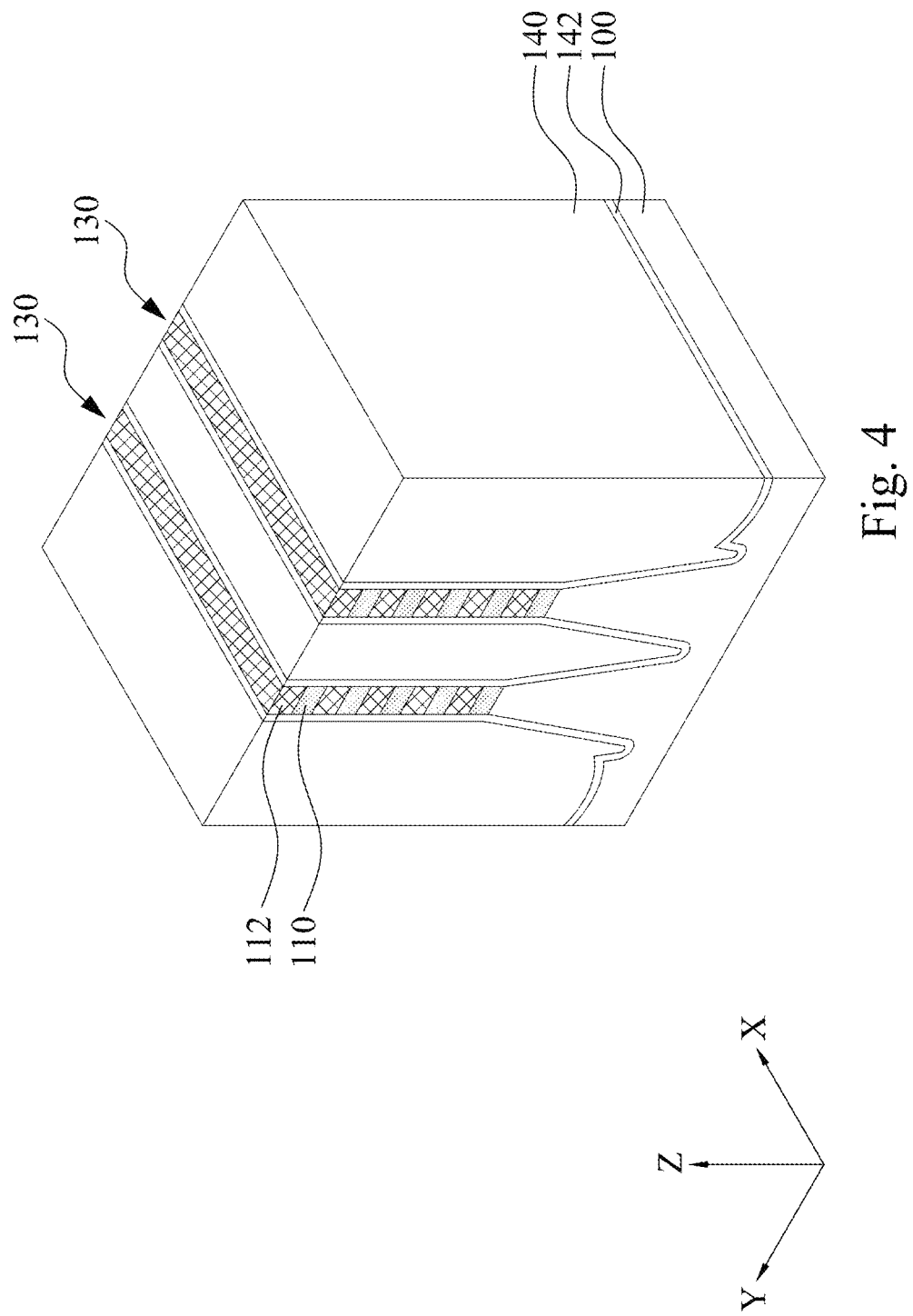

Referring to FIG. 4, after the fin structures 130 is formed, an insulating material layer 140 including one or more layers of insulating material is formed over the substrate so that the fin structures 130 are fully embedded in the insulating material layer 140. The insulating material for the insulating material layer 140 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating material layer 140. Then, a planarization operation, such as a chemical mechanical polishing (CMP) method and/or an etch-back method, is performed such that the upper surface of the uppermost second semiconductor layer 112 is exposed from the insulating material layer 140. In some embodiments, a first liner layer 142 is formed over the structure of FIG. 3 before forming the insulating material layer 140. The first liner layer 142 is made of SiN or a silicon nitride-based material (e.g., SiON, SiCN or SiOCN).

Figure 5:
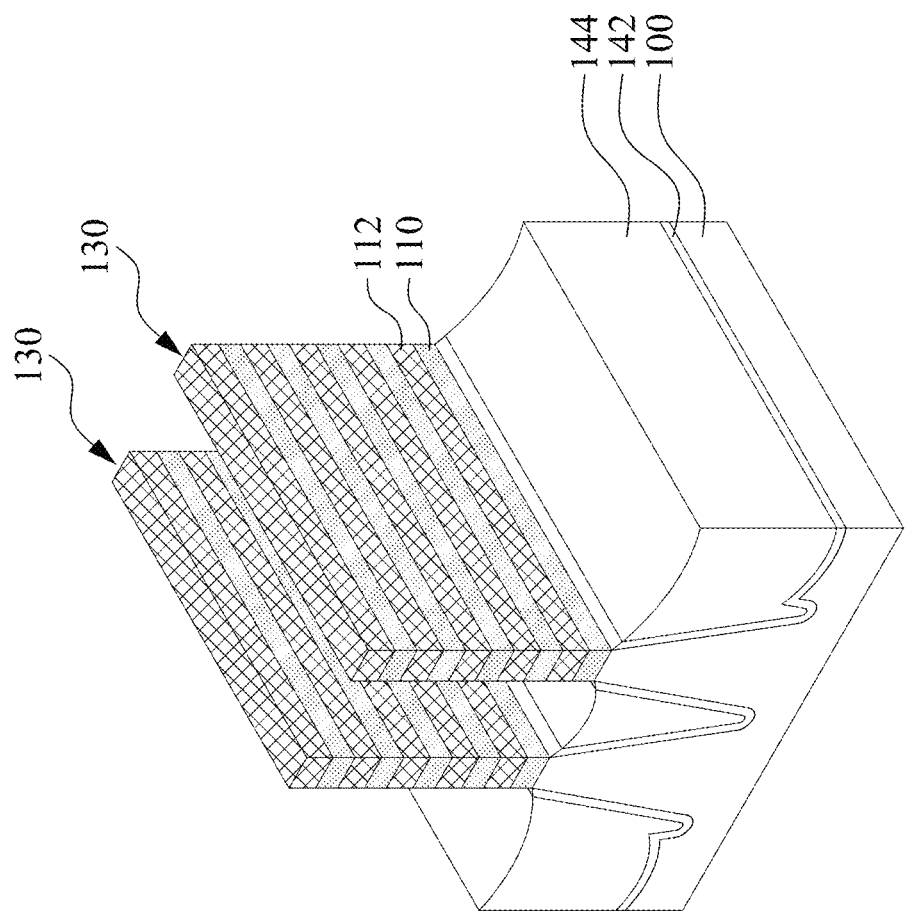

Then, as shown in FIG. 5, the insulating material layer 140 (as shown in FIG. 4) is recessed to form an isolation insulating layer 144 so that the upper portions of the fin structures 130 are exposed. With this operation, the fin structures 130 are electrically insulated from each other by the isolation insulating layer 144, which is also referred to as a STI structure. In some embodiments, the insulating material layer 140 is recessed until the bottommost first semiconductor layer 110 is exposed. The first semiconductor layers 110 are sacrificial layers which are subsequently partially removed, and the second semiconductor layers 112 will serve as channel regions of a GAA FET.

Figure 6:
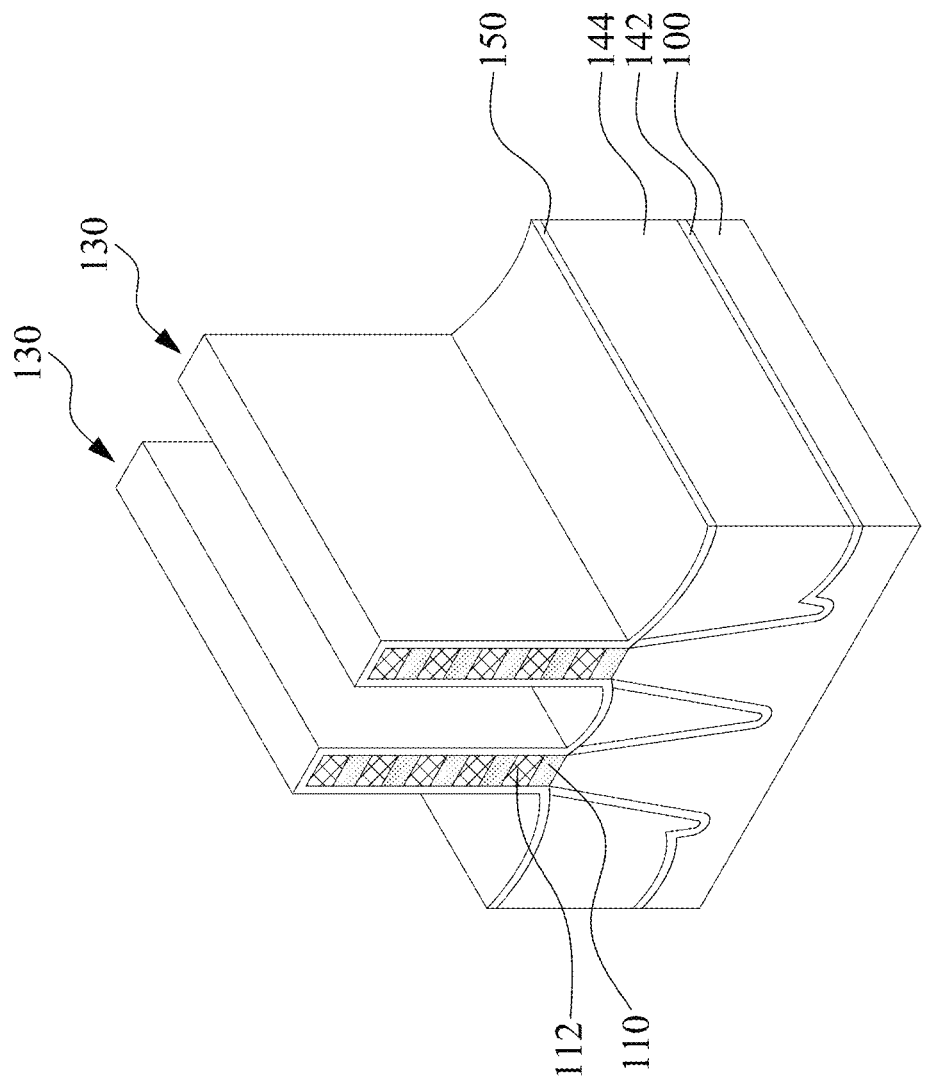

After the isolation insulating layer 144 is formed, a sacrificial gate dielectric layer 150 is formed, as shown in FIG. 6. The sacrificial gate dielectric layer 150 includes one or more layers of insulating material, such as a silicon oxide-based material. In one embodiment, silicon oxide formed by CVD is used.

Figure 7:
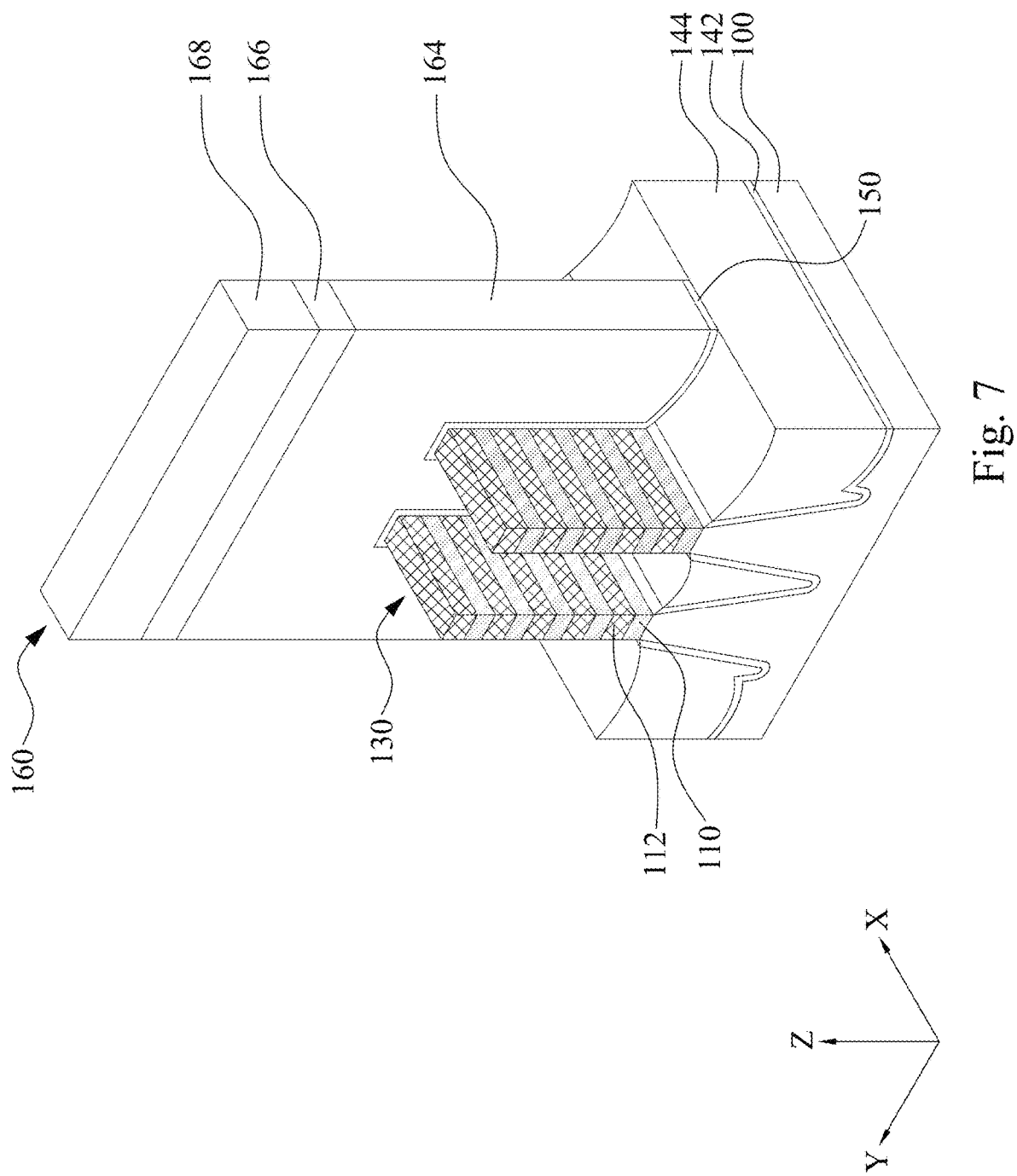

Afterwards, a sacrificial gate layer and a mask layer (e.g., having a pad SiN layer and a silicon oxide mask layer) are formed over the sacrificial gate dielectric layer 150, followed by patterning the mask layer, the sacrificial gate electrode layer and the sacrificial gate dielectric layer 150 into the sacrificial gate structure 160, as shown in FIG. 7. The sacrificial gate structure 160 includes the sacrificial gate dielectric layer 150, the sacrificial gate electrode layer 164 (e.g., poly silicon), the pad SiN layer 166 and the silicon oxide mask layer 168. The stacked layers of the first and second semiconductor layers 110, 112 are partially exposed on opposite sides of the sacrificial gate structure 160, thereby defining source/drain (S/D) regions. In this disclosure, a source and a drain are interchangeably used and the structures thereof are substantially the same.

Figure 8:
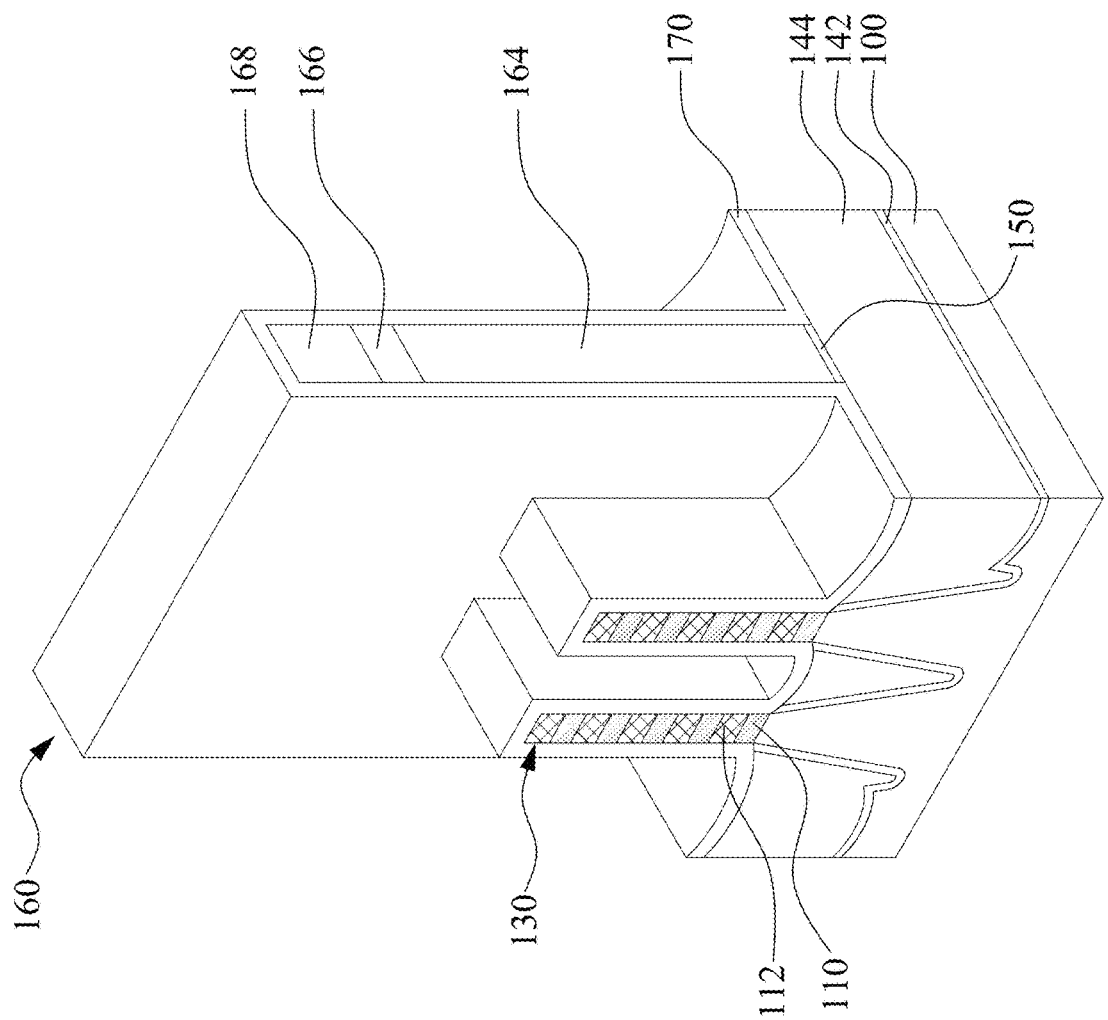

Referring to FIG. 8, after the sacrificial gate structure 160 is formed, a blanket layer 170 of an insulating material for sidewall spacers is conformally formed by using CVD or other suitable methods. The blanket layer 170 is deposited in a conformal manner so that it is formed to have substantially equal thicknesses on vertical surfaces, such as the sidewalls, horizontal surfaces, and the top of the sacrificial gate structure. In some embodiments, the blanket layer 170 is deposited to a thickness in a range from about 2 nm to about 10 nm. In one embodiment, the insulating material of the blanket layer 170 is a silicon nitride-based material, such as SiN, SiON, SiOCN or SiCN and combinations thereof.

Figure 9A:
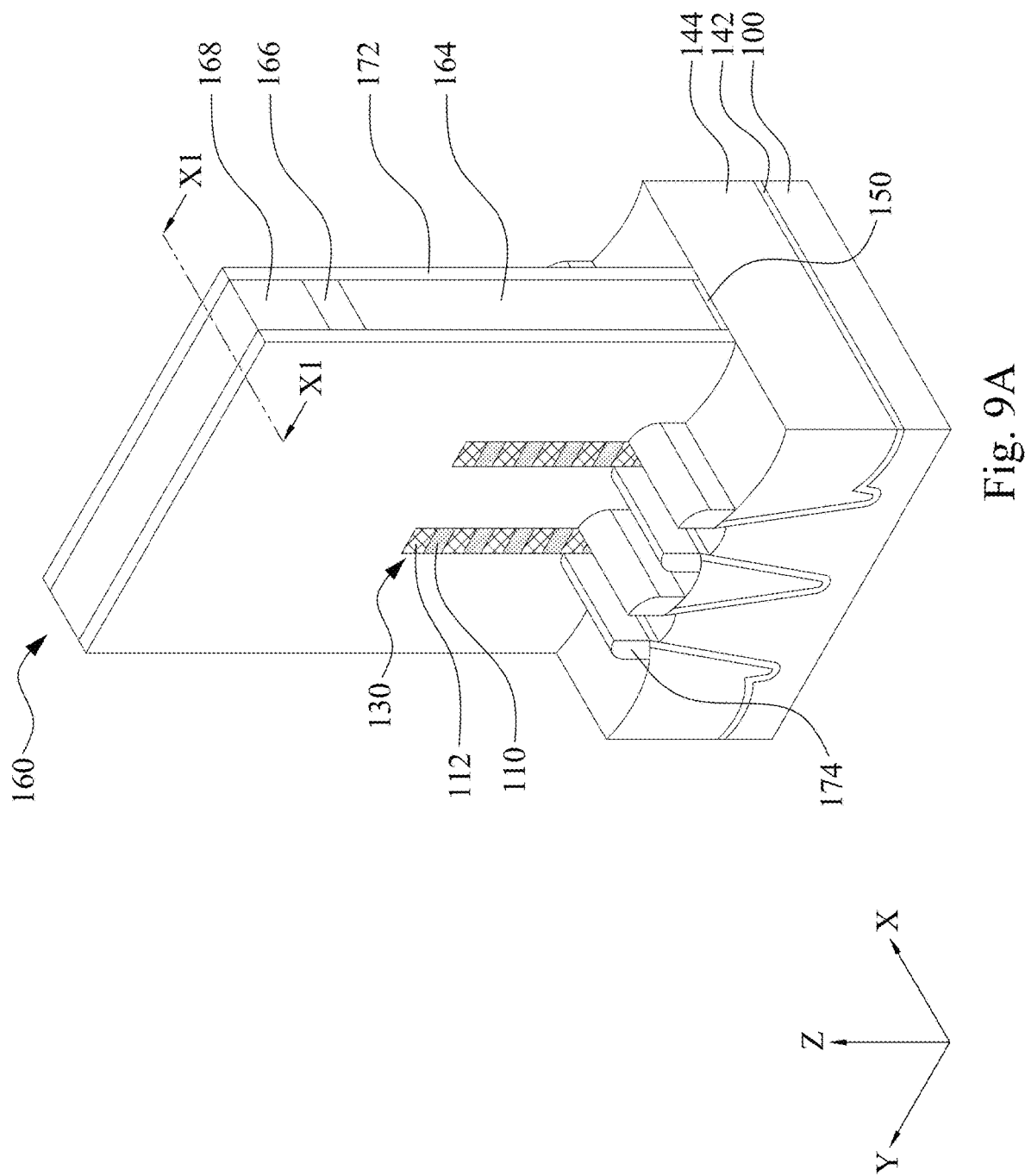

The blanket layer 170 is then etched using an anisotropic process to form gate sidewall spacers 172 on opposite sidewalls of the sacrificial gate structure 160 and fin sidewall spacers 174 on opposite sidewalls of the fin structures 130, followed by etching exposed portions of the fin structures 130 that extend laterally beyond the gate sidewall spacers 172. The resulting structure is illustrated in FIGS. 9A and 9B, wherein FIG. 9B is the cross sectional view corresponding to line X1-X1 of FIG. 9A. In FIG. 9B, the cross section of the bottom parts of one sacrificial gate structure 160 is illustrated. In some embodiments, the anisotropic process can be control such that no fin sidewall spacers 174 remain on the STI region 144.

The anisotropic etching performed on the blanket layer 170 can be, for example, reactive ion etching (RIE). During the anisotropic etching process, most of the insulating material is removed from horizontal surfaces, leaving the dielectric spacer layer on the vertical surfaces such as the sidewalls of the sacrificial gate structures 160 and the sidewalls of the exposed fin structures 130. The mask layer 168 may be exposed from the sidewall spacers.

Figure 10A:
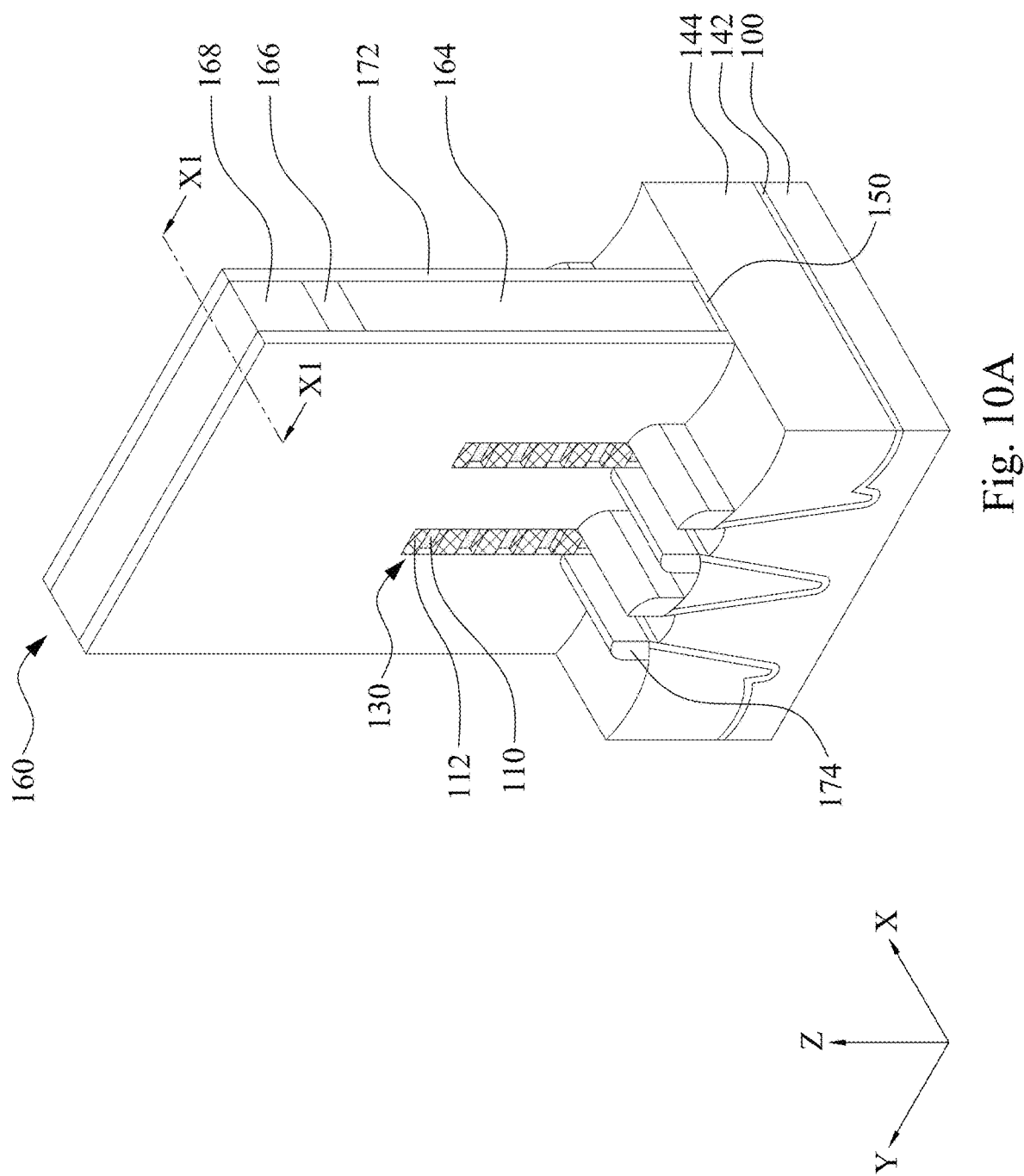
Figure 10B:
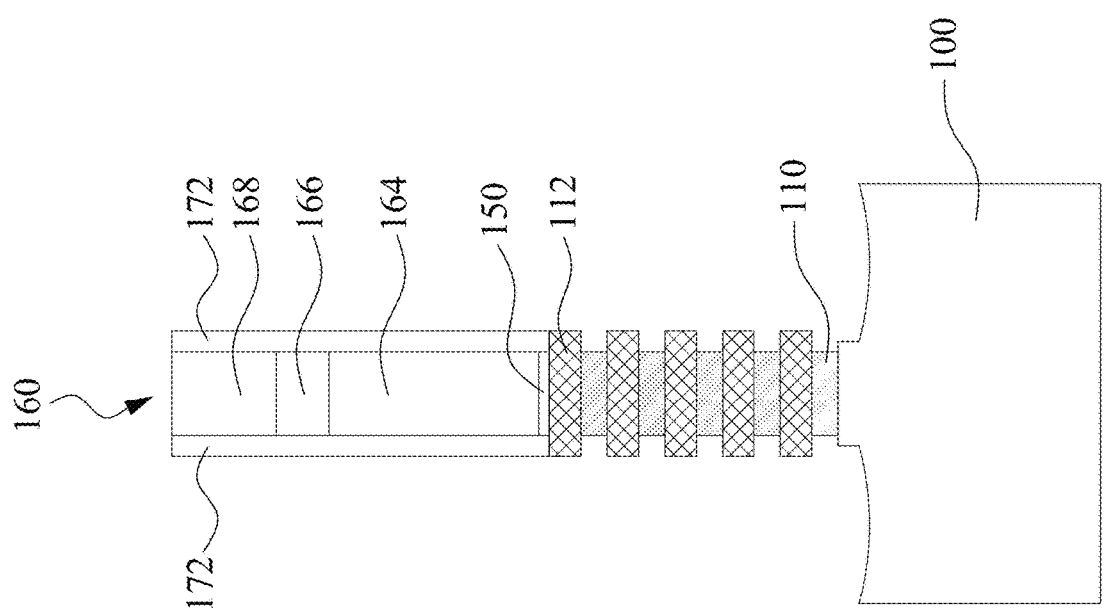

Subsequently, as shown in FIGS. 10A and 10B, the first semiconductor layers 110 are horizontally recessed (etched) so that the second semiconductor layers 112 laterally extend past opposite end surfaces of the first semiconductor layers 110. In some embodiments, as shown in FIG. 10B, end surfaces of the first semiconductor layers 110 may be substantially vertically aligned with the side surfaces of the sacrificial gate electrode layer 164. Here, "substantially vertically alignment" means the horizontal offset is less than about 1 nm.

During the recess etching of the first semiconductor layers 110 as illustrated in FIGS. 10A and 10B, the second semiconductor layers 112 may be also horizontally etched. The recessed amount of the first semiconductor layers 110 is greater than the recessed amount of the second semiconductor layers 112. In this way, the resulting second semiconductor layers 112 can laterally extend past opposite end surfaces of the first semiconductor layers 110.

Figure 11A:
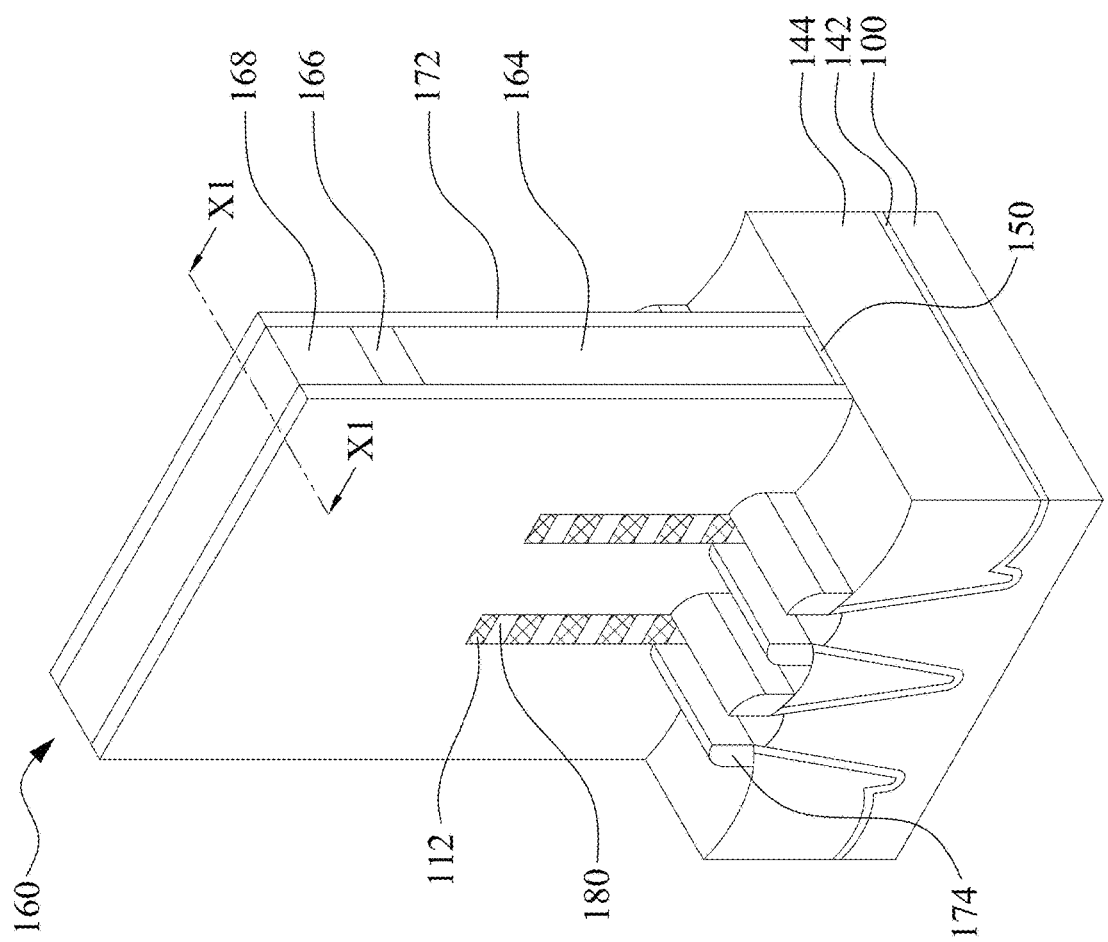
Figure 11B:
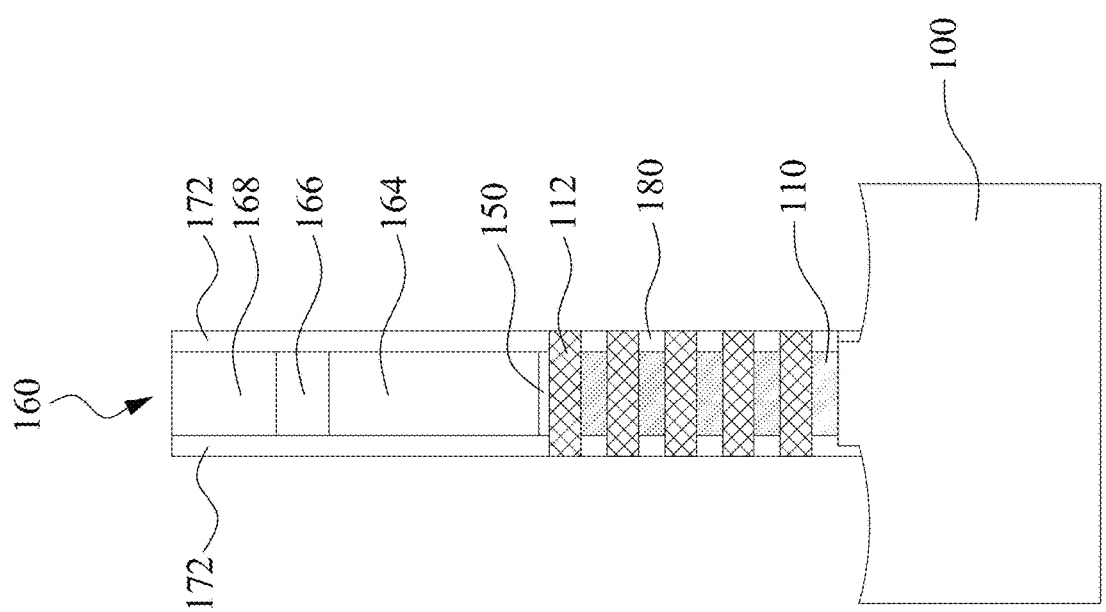

After the first semiconductor layers 110 are horizontally recessed, an inner spacer 180 is formed on the recessed surfaces of the first and second semiconductor layers 110, 112, as shown in FIGS. 11A and 11B. Formation of the inner spacer 180 includes depositing an inner spacer material layer (e.g., silicon nitride), followed by etching back the inner spacer material layer by an anisotropic etching process, to remove the inner spacer material layer from the substrate 100.

In some embodiments, the inner spacer 180 includes insulating material such as silicon nitride or the like.

Figure 12:
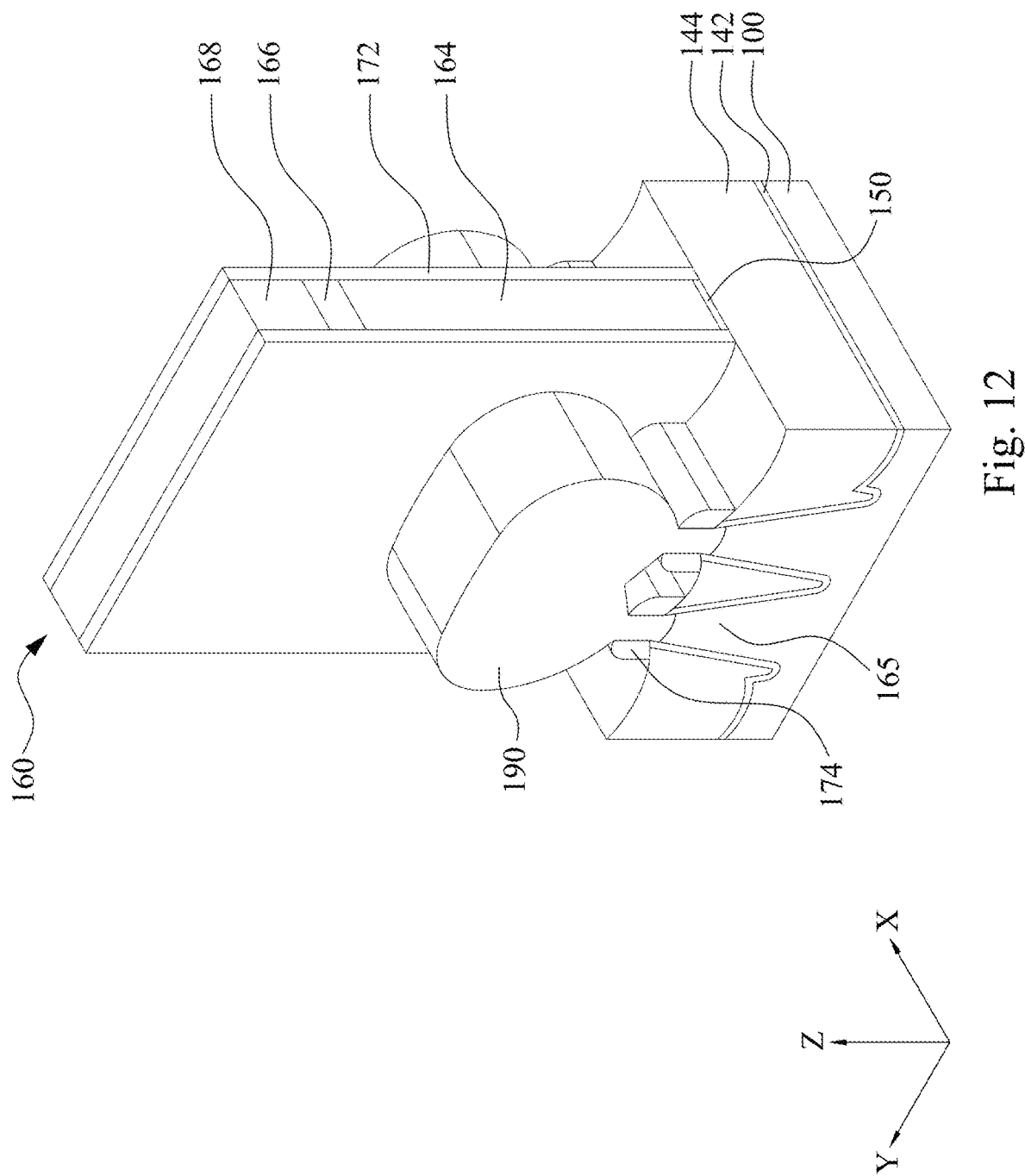

After the inner spacer 180 is formed, source/drain (S/D) epitaxial layers 190 are epitaxially grown from the exposed recessed fins 165 between the fin sidewall spacers 174, as shown in FIG. 12. The S/D epitaxial layer 190 includes one or more layers of Si, SiGe or Ge for a p-channel FET. The S/D layers 190 are formed by an epitaxial growth method using CVD, ALD or molecular beam epitaxy (MBE). In some embodiments, the epitaxial layers 190 grown from neighboring recessed fins 165 of the substrate 100 merge above the STI 144 and form a void in some embodiments. In some other embodiments, the epitaxial layers 190 grown from neighboring recessed fins 165 do not merged.

Figure 13:
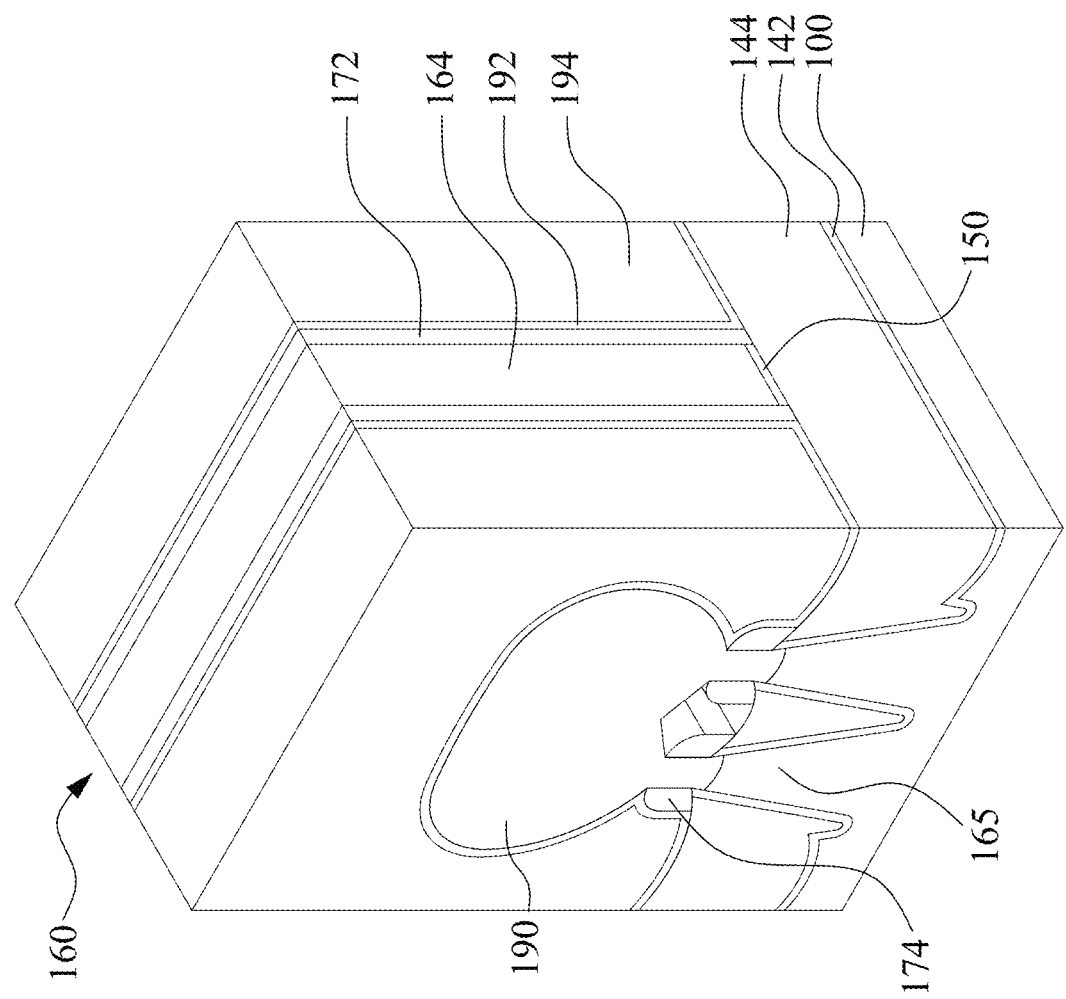

Subsequently, a second liner layer 192 is formed and then an interlayer dielectric (ILD) layer 194 is formed, as shown in FIG. 13. The second liner layer 192 is made of a silicon nitride-based material, such as SiN, and functions as a contact etch stop layer in the subsequent etching operations. The materials for the ILD layer 194 include compounds comprising Si, O, C and/or H, such as silicon oxide, SiCOH and SiOC. Organic materials, such as polymers, may be used for the ILD layer 194.

As shown in FIG. 13, after the ILD layer 194 is formed, a planarization operation, such as CMP, is performed, so that the top portion of the sacrificial gate structure 160 is exposed.

Figure 14:
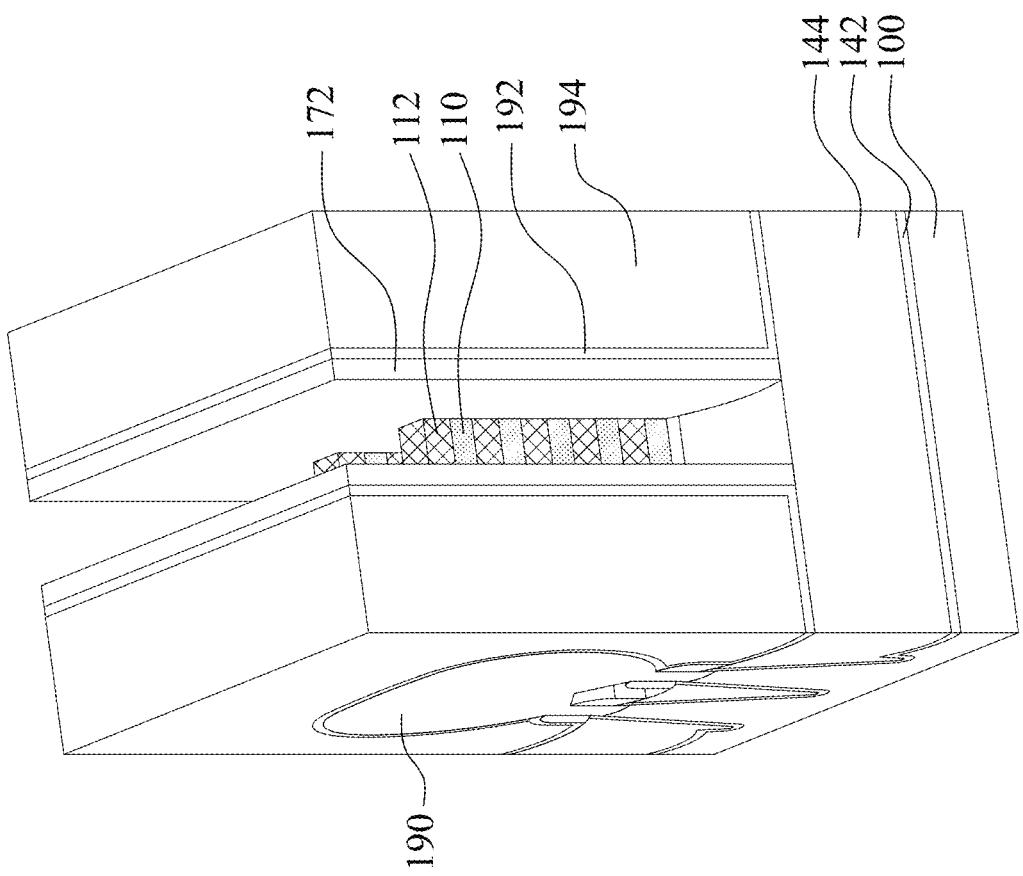

Next, as shown in FIG. 14, the sacrificial gate electrode layer 164 (see FIG. 9B) and sacrificial gate dielectric layer 150 (see FIG. 9B) are removed, thereby exposing the fin stack of the first and second semiconductor layers 110, 112 and a gate trench is formed between the gate spacers.

The ILD layer 194 protects the S/D structures 190 during the removal of the sacrificial gate structures. The sacrificial gate structures can be removed using plasma dry etching and/or wet etching. When the sacrificial gate electrode layer 164 is polysilicon and the ILD layer 194 is silicon oxide, a wet etchant such as a TMAH solution can be used to selectively remove the sacrificial gate electrode layer 164. The sacrificial gate dielectric layer 150 is thereafter removed using plasma dry etching and/or wet etching.

Figure 15A:
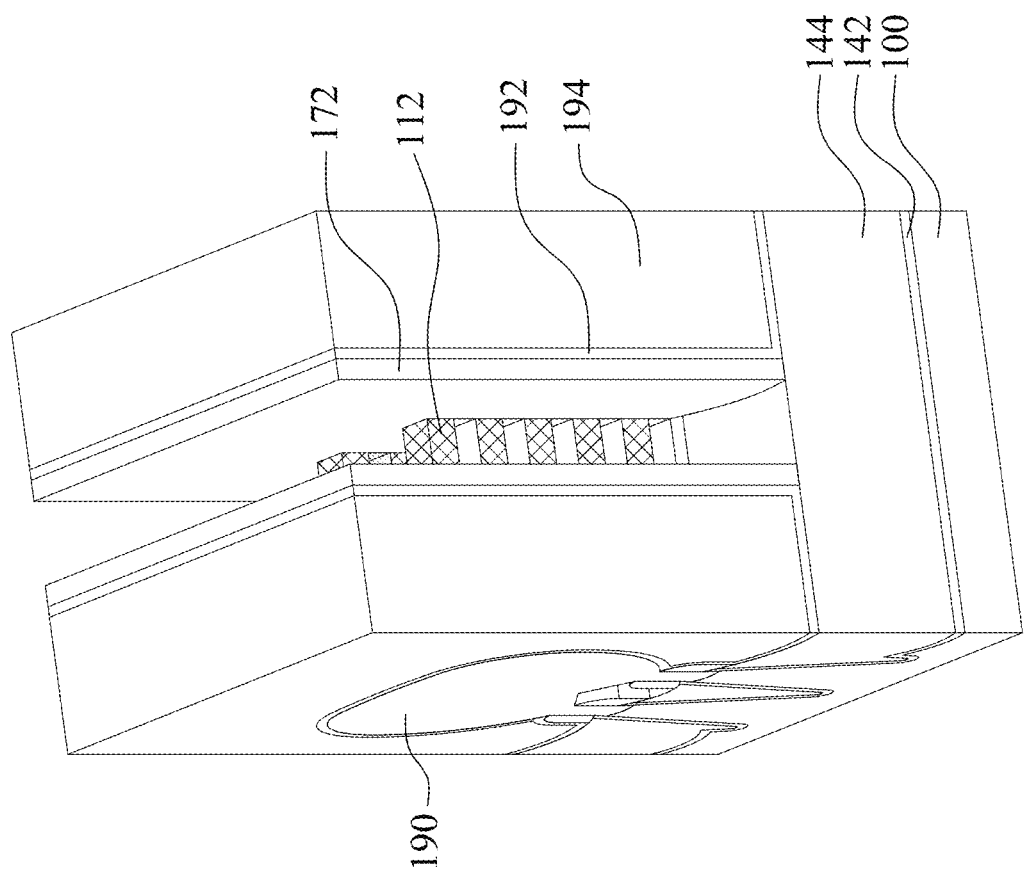
Figure 15B:
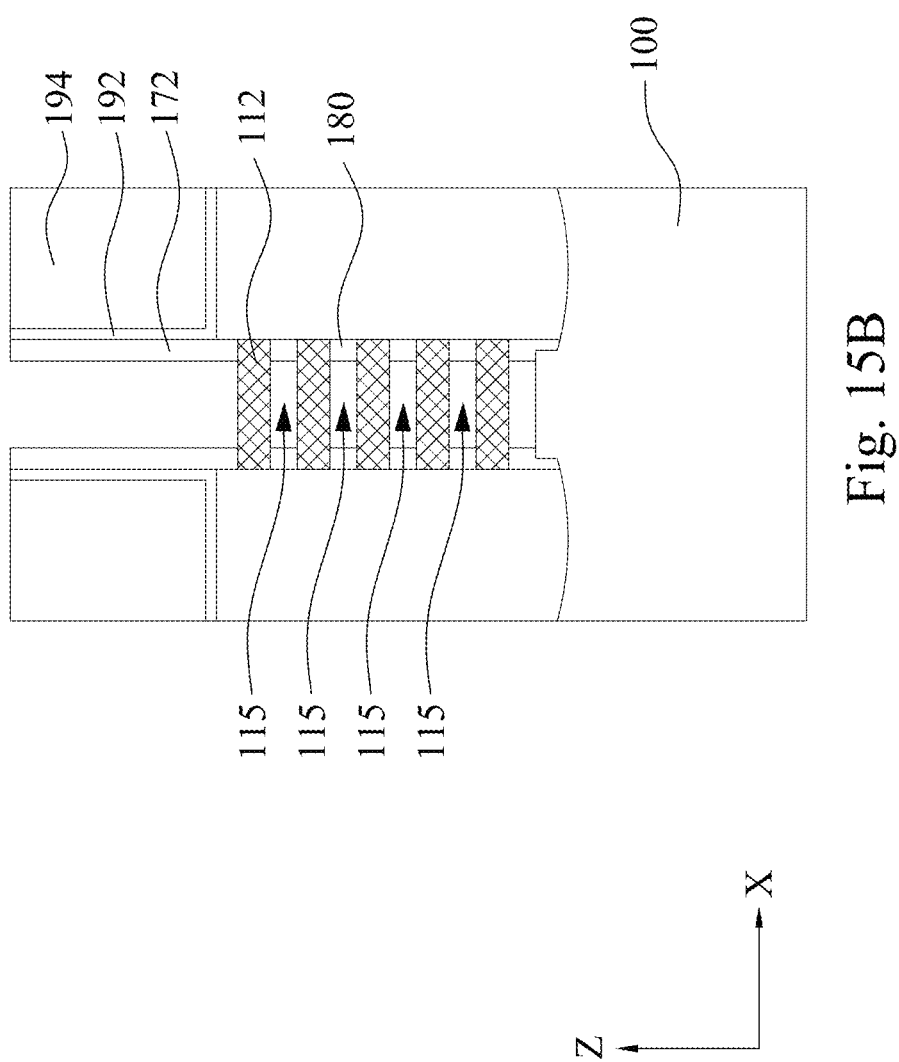

After the sacrificial gate structures are removed, the first semiconductor layers 110 (as shown in FIG. 14) in the fin structures are removed, as shown in FIGS. 15A and 15B. That is, the first semiconductor layers 110 (see FIG. 14) are etched. As a result, portions of the second semiconductor layers 112 are suspended. In the following discussion, the portions of the second semiconductor layers 112 suspended are also referred to as and serve as the channel layers (or nanosheets). The channel layers 112 are slightly etched or not etched. In the present embodiments, the channel layers 112 are slightly etched to form a rectangular-like shape (e.g., a nanosheet). FIG. 15B is the cross sectional view along the fin structure. Gaps 115 are left between neighboring channel layers 112. The first semiconductor layers 110 can be removed or etched using an etchant that can selectively etch the first semiconductor layers 110 at a faster etching rate than etching the second semiconductor layers 112. The channel layers 112 extend in the X-direction above the substrate 100 and are arranged in the Z direction perpendicular to the X-direction.

In some embodiments, the first semiconductor layers 110 (also called sacrificial layers to be removed) are SiGe and the second semiconductor layers 112 (also called channel layers to be left in final GAA transistors) are silicon allowing for the selective removal of the first layers 110. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 112 may not be significantly etched by the channel release process.

In the present embodiment, since the inner spacer 180 is made of a material that has etching selectivity to that of the first semiconductor layers 110, the inner spacer can protect the source/drain epitaxial layers 190 from the etchant used in etching the first semiconductor layers 110.

Figure 16:
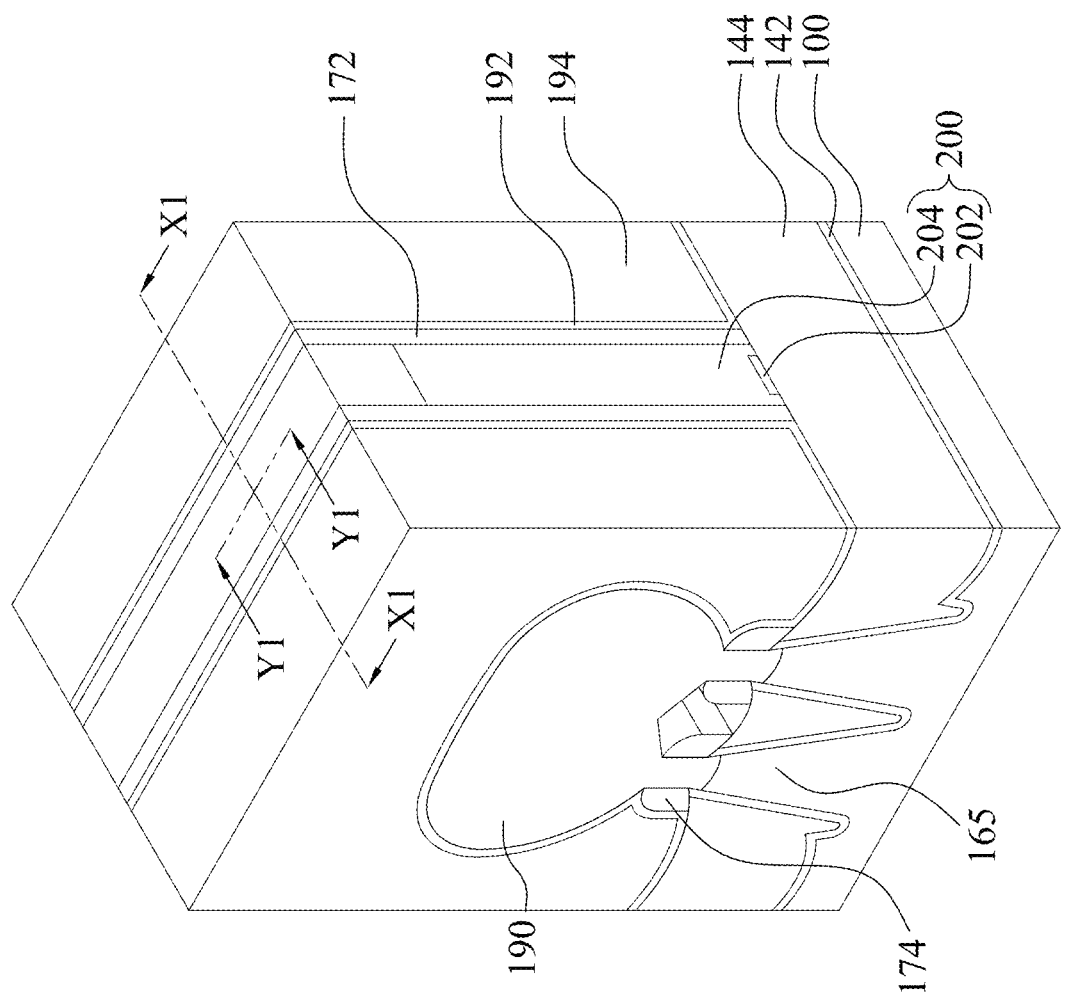

Referring to FIG. 16, a gate dielectric layer 202 is formed around each channel layers 112, and a metal gate electrode 204 is formed on the gate dielectric layer 202. The gate dielectric layer 202 and the metal gate electrode 204 are collectively referred as to a metal gate structure 200. The metal gate structure 200 extends in a Y direction which is perpendicular to the X direction and the Z direction. The exemplary sequential processes of the formation of the metal gate structure 200 will be discussed in the following figures.

Figure 17B:
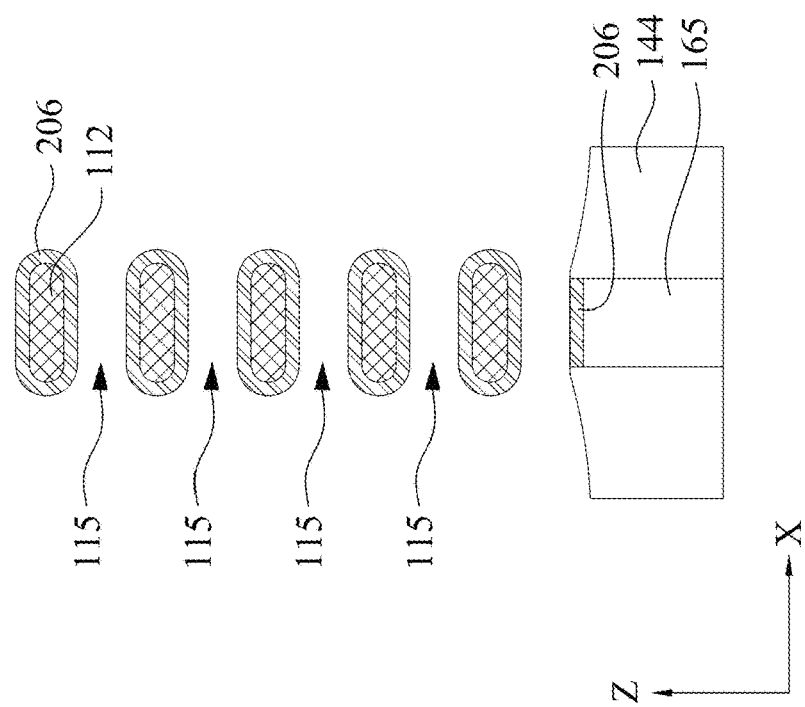
Figure 17A:
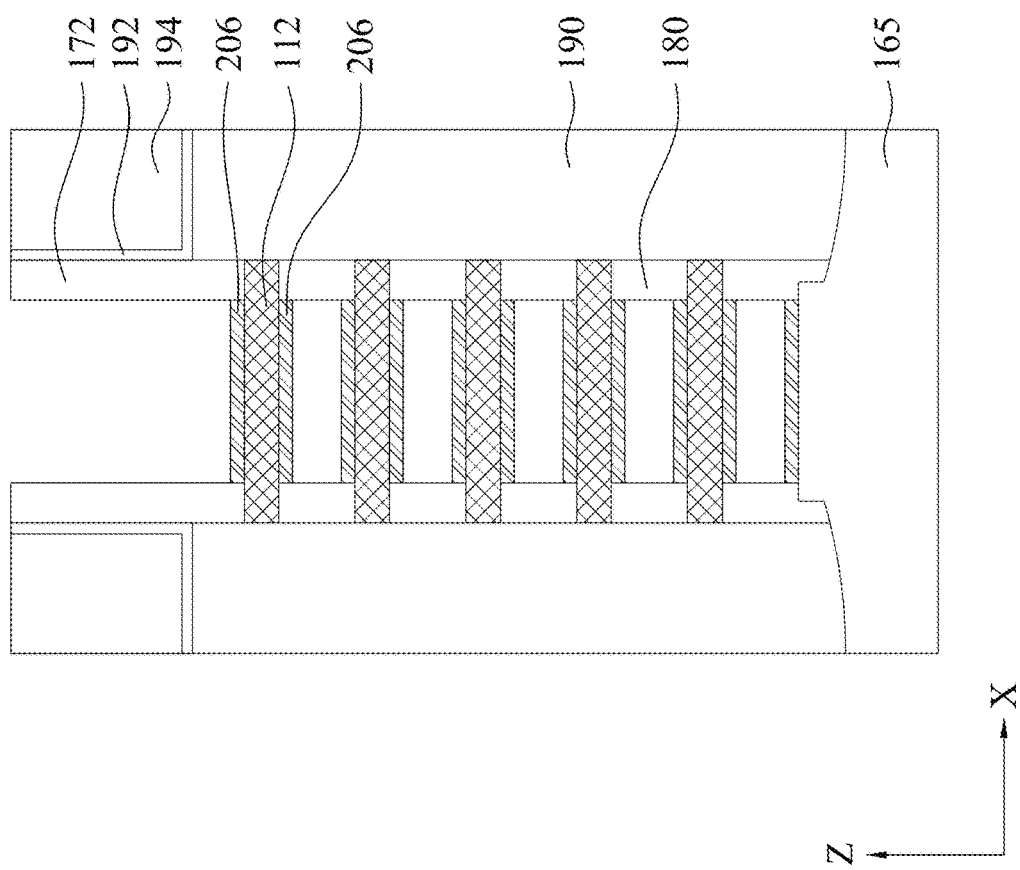

FIG. 17A to FIG. 21B are various cross-sectional views of a GAA device at different stages of fabrication, according to some embodiments of the disclosure, in which "A" are the cross sectional views corresponding to line X2-X2 of FIG. 16, and "B" are the cross sectional views corresponding to line Y1-Y1 of FIG. 16. FIGS. 17A and 17B follow after FIGS. 15A and 15B.

After the first semiconductor layers 110 are removed, interfacial layers 206 are formed on surface of the channel region, e.g., the surface of the channel layers 112, and on the surface of the recessed fins 165. The interfacial layers 206 are formed of silicon oxide or silicon oxynitride grown by a thermal oxidation process. For example, the interfacial layer 206 can be grown by a rapid thermal oxidation (RTO) process or by an annealing process using oxygen.

Referring to FIGS. 18A and 18B, after the interfacial layers 206 are formed, a high-k gate dielectric layer 208 is formed along the gate sidewall spacers 172, the surface of the inner spacer 180, the surface of the ILD layer 194 and the interfacial layer 206, by a deposition process. In some embodiments, the high-k gate dielectric layer 132 may include metal oxides. Examples of metal oxides used for high-k gate dielectric layer 132 include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The high-k dielectric layer 208 may be formed using a suitable process such as atomic layer deposition (ALD), chemical vapor deposition (CVD), physical vapor deposition (PVD) or other suitable method.

Figure 19B:
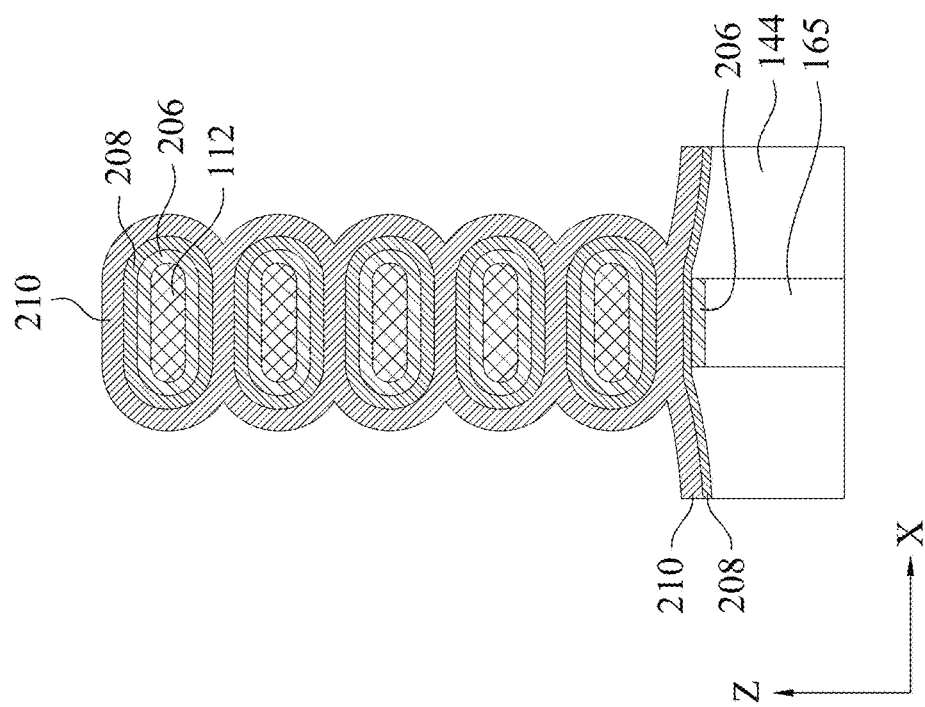
Figure 19A:
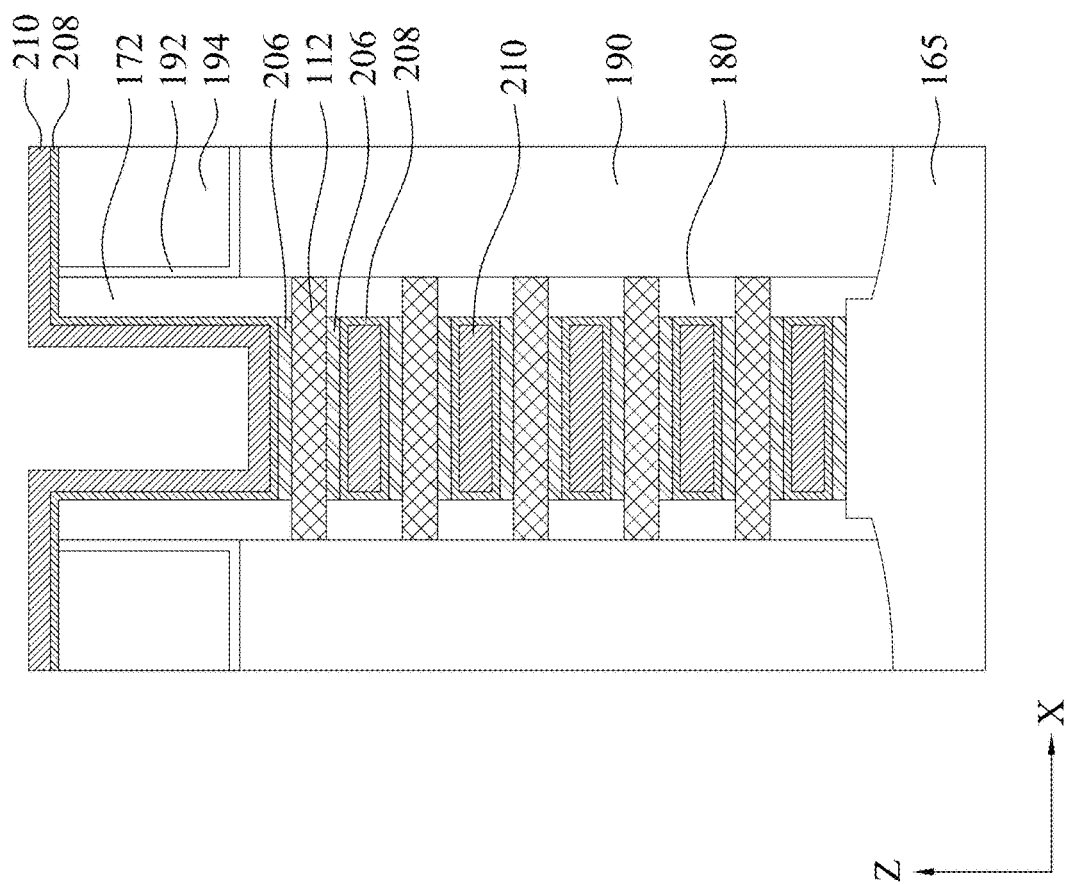

Reference is made to FIGS. 19A and 19B. A work function layer 210 is formed on the high-k gate dielectric layer 208. For example, the work function layer 210 is deposited to surround each of the channel layers (or nanosheets) 112. A portion of the work function layer 210 is formed vertically between adjacent channel layers (or nanosheets) 112 and fills the gap 113 between adjacent channel layers 112. In the present embodiment, the work function layer 210 may be a p-type work function layer. Exemplary p-type work function materials include titanium nitride, TaN, Ru, Mo, Al, WN, $ZrSi_2$, $MoSi_2$, $TaSi_2$, $NiSi_2$, WN, other suitable p-type work function materials, or combinations thereof. In some embodiments, the work function layer 210 is a nitride layer. In some embodiments where the work function layer 210 is a titanium nitride layer, the work function layer 210 may be formed by plasma enhanced atomic layer deposition (PEALD) by sequentially introducing a titanium-based precursor and nitrogen-based plasma as a reactant. Example of a titanium-based precursor include titanium organometallic precursor such as tetrakisdimethyl titanium ($Ti[N(CH_3)_2]_4$, TDMAT). In some embodiments, $N_2$ plasma may be used during the deposition process to dissociate the precursor. In other words, the TDMAT is dissociated by the $N_2$ plasma.

As compared to atomic layer deposition (ALD) method which uses a thermally activated reaction, the deposition temperature is lower during PEALD. The PEALD may have lower deposition temperatures (a lower thermal budget) compared to their thermal counterparts (e.g., methods that use only thermal energy for the dissociation of the precursors), since the plasma can provide additional "energy" that is available for the dissociation of precursors is necessary. Consequently, a similar thermal process may need to operate at a higher temperature if the same reactants are used. For example, a thermal (e.g., ALD) process of titanium nitride deposition may operate at substrate temperatures of greater than 450° C. In some embodiments where the work function layer 210 includes titanium nitride, the PEALD process of titanium nitride deposition is performed at a substrate temperature below about 450° C. For example, the PEALD process is performed at a substrate temperature of about 250° C. to about 450° C. and under a pressure of about 1 torr to about 20 torr. Since an atomic ratio of titanium to nitrogen (Ti/N) of titanium nitride is proportional to the formation temperature thereof, by forming titanium nitride at a temperature of about 250° C. to about 450° C., the atomic ratio of Ti/N in the work function layer 210 can be less than 1, which means nitrogen atomic percentage is higher than titanium atomic percentage in the work function layer 210. In this case, the work function layer 210 can be interchangeably referred to as a nitrogen-dominant or nitrogen-rich TiN layer. For example, the atomic ratio of Ti/N in the work function layer 210 is in a range from about 0.6 to about 1. The threshold voltage can be controlled by the atomic ratio of Ti/N in titanium nitride. Such reduced atomic ratio is beneficial for decreasing the threshold voltage. In some embodiments, the decreasing amount of the threshold voltage is in a range from about 35 mV to about 40 mV.

Figure 22:
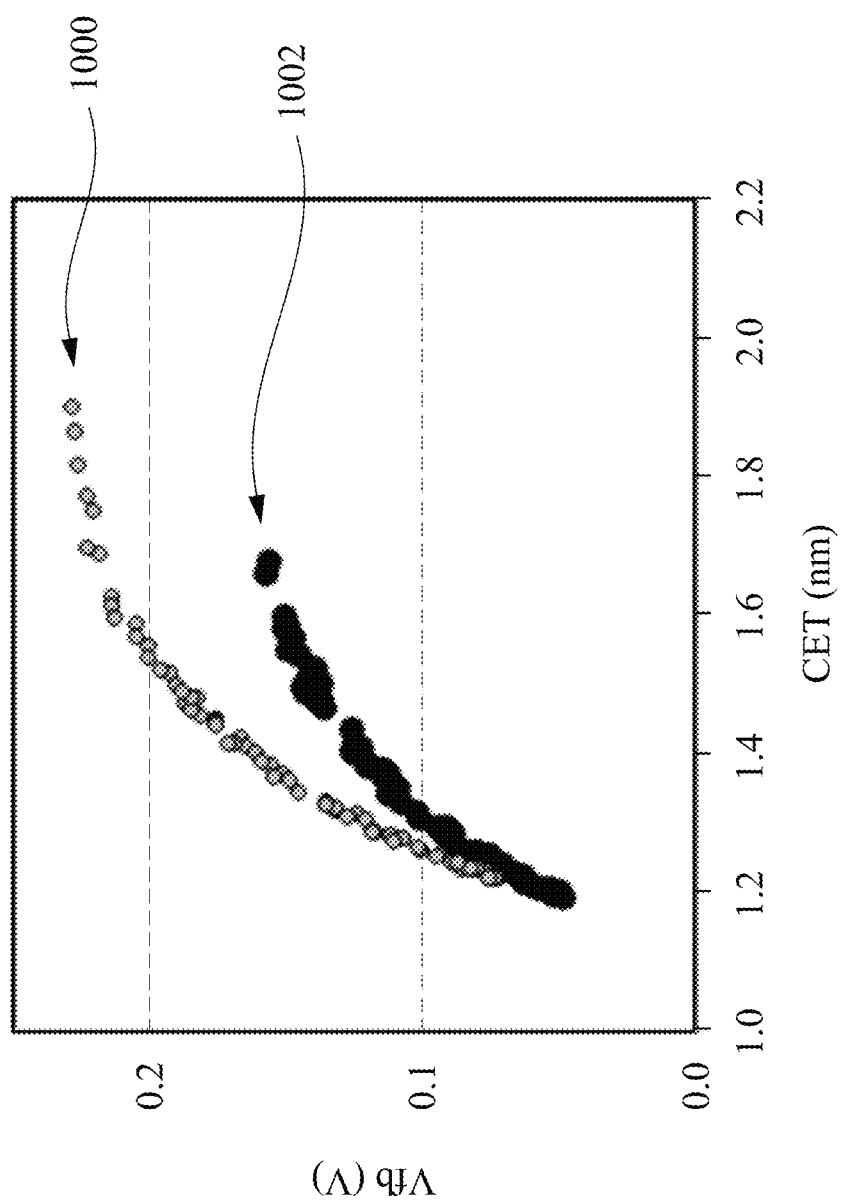
FIG. 22 is a chart illustrating flat band voltage (Vn) versus capacitance equipment thickness (CET) with respect to a work function layer in FIGS. 19A and 19B and a reference titanium nitride layer.
Figure 23:
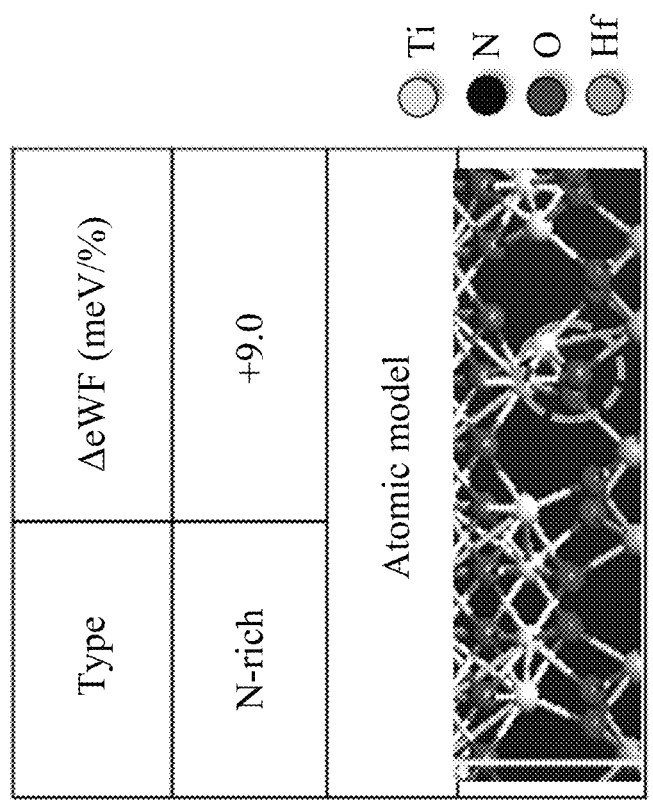
FIG. 23 is an atomic model of the work function layer in FIGS. 19A and 19B.

FIG. 22 is a chart illustrating flat band voltage (Vn) versus capacitance equipment thickness (CET) with respect to the nitrogen-rich TiN layer 210 in FIGS. 19A and 19B and a reference TiN layer (with atomic ratio of Ti/N equal to 1). Referring to FIG. 22, a Vn curve 1000 of the nitrogen-rich TiN layer 210 and a Vn curve 1002 of the reference TiN layer are depicted. The Vn curves 1000 and 1002 are given in terms of the flat band voltage (Vn) in voltage versus the capacitance equipment thickness (CET) in nanometer. As shown in FIG. 22, a flat band voltage of the nitrogen-rich TiN layer 210 is higher than a flat band voltage of the reference TiN layer. That is, the flat band voltage of the nitrogen-rich TiN layer 210 shifts towards the p-type band-edge work function. Therefore, a threshold voltage of the nitrogen-rich TiN layer 210 may be lower than a threshold voltage of the reference TiN layer. FIG. 23 is an atomic model of the nitrogen-rich TiN layer 210 in FIGS. 19A and 19B (see FIGS. 19A and 19B). Referring to FIG. 23, according to density-functional theory (DFT) calculation, nitrogen-rich (N-rich) titanium nitride is beneficial to p-type work function since it can provide increased effective work function (eWf), for example, about 9 meV/% or more.

Figure 24:
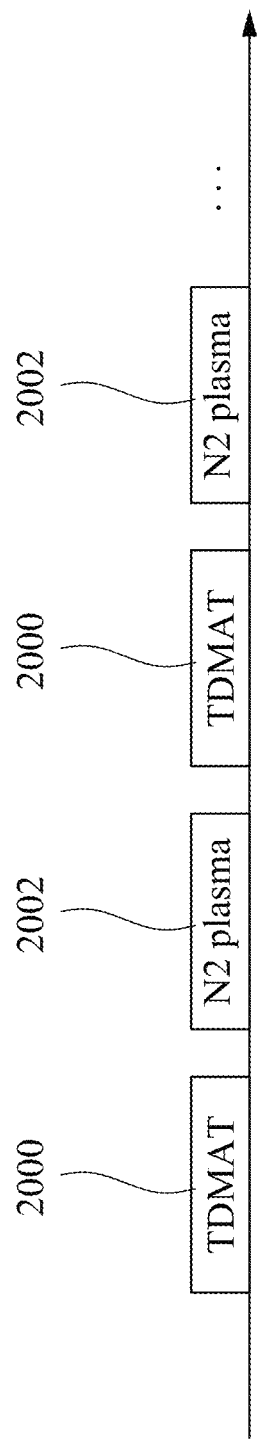
FIG. 24 shows a schematic diagram of a sequence of a plasma enhanced atomic layer deposition (PEALD) process according to some embodiments of the disclosure.

FIG. 24 shows a schematic diagram of a sequence of the PEALD process according to some embodiments of the disclosure. Referring to FIG. 24, the formation of the nitrogen-rich TiN layer 210 is a cyclic process. The cyclic process includes one or more repetitions of a TDMAT providing step 2000 and an $N_2$ plasma providing step 2002. The repetitions continue until the nitrogen-rich TiN layer 210 (see FIGS. 19A and 19B) of a desired thickness is obtained. For example, the titanium-rich TiN material is merged into a continuous structure during the PEALD to form the work function layer 210. In some embodiments, the number of repetitions of TDMAT providing step 2000 and $N_2$ plasma providing step 2002 is about 10 to about 50.

Referring back to FIGS. 20A and 20B, a glue layer 212 is formed on and surrounds the work function layer 210. The glue layer 212 may be used to increase adhesion between the work function layer 210 and a subsequently formed metal fill layer (see FIGS. 21A and 21B) so as to prevent the metal fill layer from peeling or delaminating. The glue layer 212 is a conformal layer and is conformally formed over the work function layer 210. In some embodiments, the glue layer 212 is a nitride layer. In some embodiments, the glue layer 212 is made of or includes tantalum nitride, titanium nitride, another suitable material, or a combination thereof and may be formed by CVD, ALD, PVD and/or other suitable process. In some embodiments, the glue layer 212 and the work function layer 210 include the same material with different stoichiometries such that the glue layer 212 and the work function layer 210 have an interface therebetween. For example, the glue layer 212 and the work function layer 210 include titanium nitride with different stoichiometries. In other words, the Ti/N atomic ratio of TiN in the glue layer 212 is different from the Ti/N atomic ratio of TiN in the work function layer 210. For example, the Ti/N atomic ratio of TiN in the glue layer 212 is greater than the Ti/N atomic ratio of TiN in the work function layer 210. In some embodiments, the Ti/N atomic ratio of TiN in the glue layer 212 is about 1. In some embodiments, the glue layer 212 has a thickness less than a thickness of the work function layer 210.

In some embodiments, the glue layer 212 and the work function layer 210 are formed by different methods. For example, the glue layer 212 is formed by ALD and the work function layer is formed by PEALD. The glue layer 212 and the work function layer 210 are formed using different titanium-based precursors. For example, the glue layer 212 is formed using titanium tetrachloride ($TiCl_4$) and the work function layer 210 is formed using TDMAT. A formation temperature of the glue layer 212 is different from a formation temperature of the work function layer 210. For example, the formation temperature of the glue layer 212 is greater than the formation temperature of the work function layer 210. In particular, in some embodiments where the glue layer 212 includes titanium nitride formed using ALD, the ALD is carried out using titanium tetrachloride (TiCl$_4$) and ammonia (NH$_3$) as precursors and argon (Ar) as purging gas at a substrate temperature greater than about 350° C.

Figure 21B:
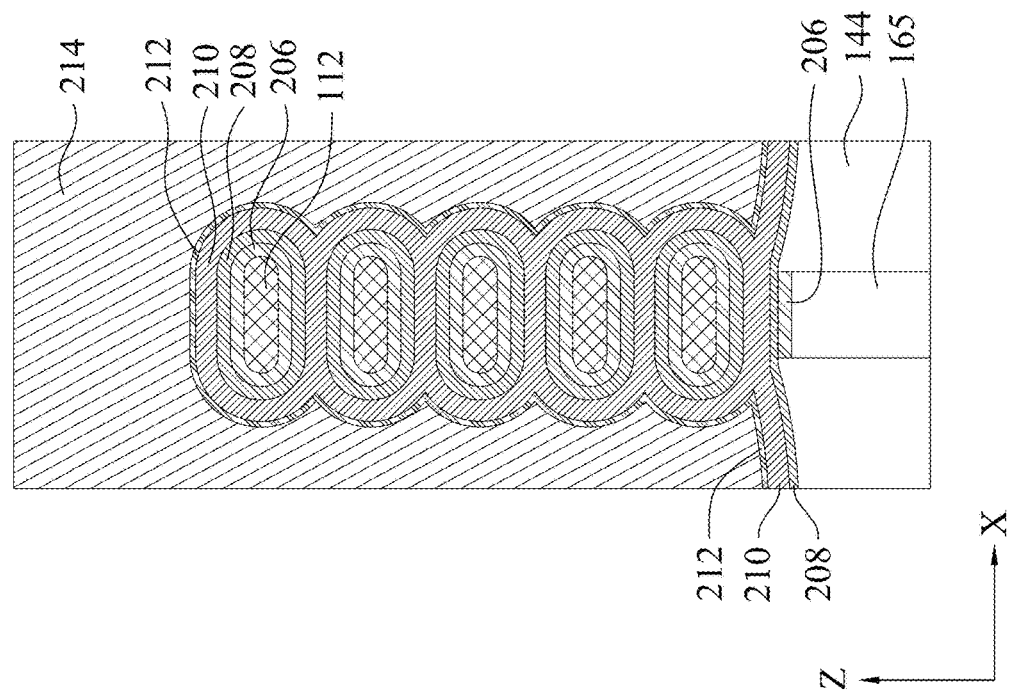
Figure 21A:
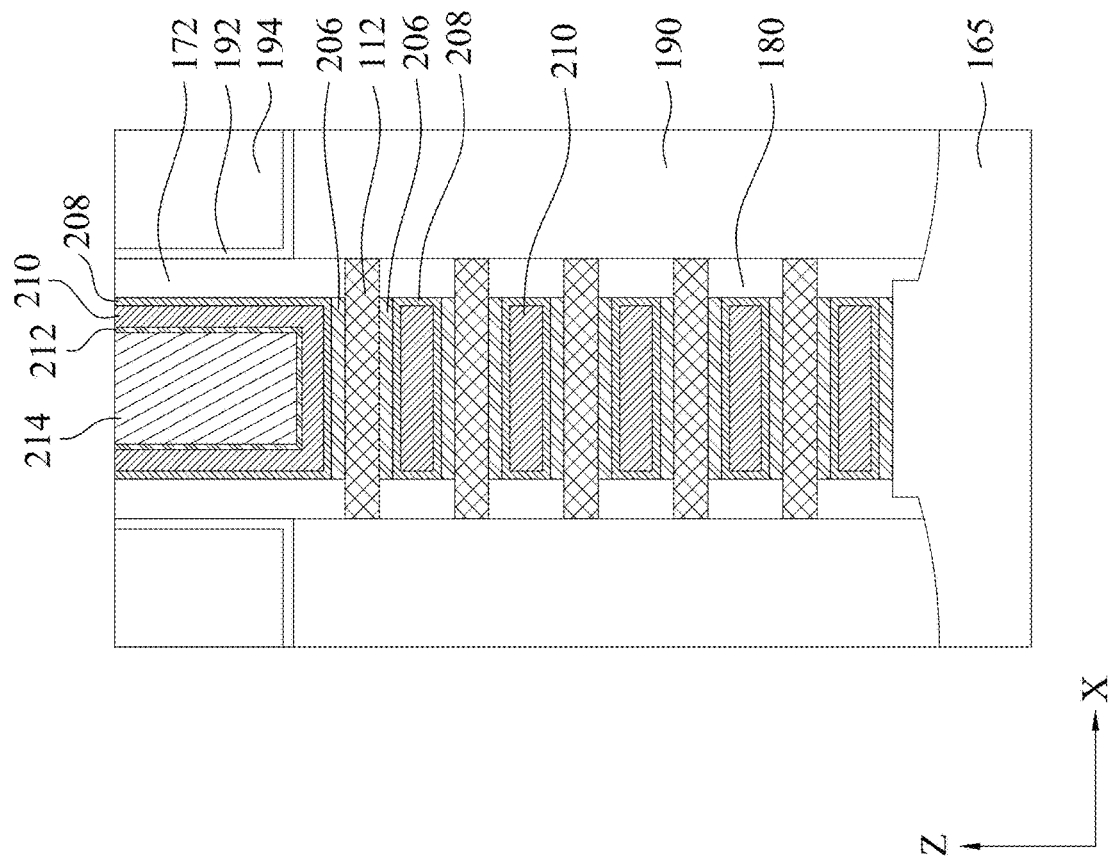

Referring to FIGS. 21A and 21B, the metal fill layer 214 is formed within a trench on the glue layer 212 between the gate sidewall spacers 172. The metal fill layer 214 is deposited over the work function layer 210. The metal fill layer 214 fills the opening 128. The metal fill layer 214 may include aluminum, tungsten, cobalt, copper, and/or other suitable materials, and may be formed by CVD, PVD, plating, and/or other suitable processes. In an embodiment, after the interfacial layers 206, the high-k gate dielectric layer 132, the work function layer 210, the glue layer 212 and the metal fill layer 214 are deposited, a CMP process is performed to planarize a top surface of the semiconductor device 10.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that the atomic ratio of Ti/N in the work function layer can be less than 1 by forming the work function layer at a temperature of about 250° C. to about 450° C. Another advantage is that such reduced atomic ratio is beneficial for decreasing the threshold voltage of an amount in a range from about 35 mV to about 40 mV.

In some embodiments, a method of forming a semiconductor device includes forming a fin structure having a stack of alternating first semiconductor layers and second semiconductor layers over a substrate, the first semiconductor layers and the second semiconductor layers having different compositions, forming a dummy gate structure across the fin structure, forming gate spacers on opposite sidewalls of the dummy gate structure, respectively, removing the dummy gate structure to form a gate trench between the gate spacers, etching the first semiconductor layers in the gate trench, such that the second semiconductor layers are suspended in the gate trench to serve as nanosheets, depositing a first titanium nitride layer surrounding each of the nanosheets, an atomic ratio of titanium to nitrogen of the first titanium nitride layer is less than 1, and forming a metal fill layer over the first titanium nitride layer.

In some embodiments, a method of forming a semiconductor device includes forming a fin structure having a stack of alternating first semiconductor layers and second semiconductor layers over a substrate, forming a dummy gate structure across the fin structure, forming gate spacers on opposite sidewalls of the dummy gate structure, respectively, removing the dummy gate structure to form a gate trench between the gate spacers, etching the first semiconductor layers in the gate trench, such that the second semiconductor layers are suspended in the gate trench to serve as nanosheets, performing a plasma deposition process to form titanium nitride materials between each of the nanosheets, wherein the plasma process is a cyclic process comprising one or more repetitions of a tetrakisdimethyl titanium (TDMAT) providing step and an N$_2$ plasma providing step, and depositing a metal fill layer over the titanium nitride materials.

In some embodiments, a semiconductor device includes a plurality of nanosheets and a gate structure. The nanosheets extend in a first direction above a semiconductor substrate and are arranged in a second direction substantially perpendicular to the first direction. The gate structure extends in a third direction perpendicular to both the first and second directions. The gate structure surrounds each of the plurality of nanosheets. The gate structure includes a first titanium nitride layer, a second titanium nitride layer and a metal fill layer. The first titanium nitride layer surround each of the plurality of nanosheets. The second titanium nitride layer surrounds the first titanium nitride layer. The second titanium nitride layer has an atomic ratio of titanium to nitrogen greater than that of the first titanium nitride layer. The metal fill layer surrounds the second titanium nitride layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a fin structure having a stack of alternating first semiconductor layers and second semiconductor layers over a substrate, the first semiconductor layers and the second semiconductor layers having different compositions;
    forming a dummy gate structure across the fin structure;
    forming gate spacers on opposite sidewalls of the dummy gate structure, respectively;
    removing the dummy gate structure to form a gate trench between the gate spacers;
    etching the first semiconductor layers in the gate trench, such that the second semiconductor layers are suspended in the gate trench to serve as nanosheets;
    depositing a first titanium nitride layer surrounding each of the nanosheets using a plasma enhanced atomic layer deposition (PEALD) that includes sequentially introducing a first titanium-based precursor and a nitrogen-based plasma, wherein the nitrogen-based plasma is used during depositing the first titanium nitride layer to dissociate the first titanium-based precursor, an atomic ratio of titanium to nitrogen of the first titanium nitride layer is less than 1, and the step of depositing the first titanium nitride layer fills a gap between adjacent two of the nanosheets; and
    forming a metal fill layer over the first titanium nitride layer.

2. The method of claim 1, further comprising:
    forming a second titanium nitride layer over the first titanium nitride layer, wherein the second titanium nitride layer and the first titanium nitride layer are formed by different deposition methods.

3. The method of claim 2, wherein an atomic ratio of titanium to nitrogen of the second titanium nitride layer is different from the atomic ratio of titanium to nitrogen of the first titanium nitride layer.

4. The method of claim 2, wherein the first titanium nitride layer is formed at a temperature lower than forming the second titanium nitride layer.

5. The method of claim 2, wherein the second titanium nitride layer is formed by introducing a second titanium-based precursor different from the first titanium-based precursor.

6. The method of claim 5, wherein one of the first titanium-based precursor and the second titanium-based precursor is organic.

7. The method of claim 1, wherein the atomic ratio of titanium to nitrogen of the first titanium nitride layer is greater than or equal to 0.6.

8. The method of claim 1, wherein a portion of the first titanium nitride layer is vertically between the adjacent nanosheets.

9. The method of claim 2, wherein the second titanium nitride layer is formed by atomic layer deposition (ALD) using titanium tetrachloride ($TiCl_4$) and ammonia ($NH_3$) as precursors and argon (Ar) as purging gas.

10. A method of forming a semiconductor device, comprising:
forming a fin structure having a stack of alternating first semiconductor layers and second semiconductor layers over a substrate;
forming a dummy gate structure across the fin structure;
forming gate spacers on opposite sidewalls of the dummy gate structure, respectively;
removing the dummy gate structure to form a gate trench between the gate spacers;
etching the first semiconductor layers in the gate trench, such that the second semiconductor layers are suspended in the gate trench to serve as nanosheets;
performing a plasma enhanced atomic layer deposition (PEALD) process to form titanium nitride materials between each of the nanosheets, wherein the PEALD process comprises a plurality of PEALD cycles, each of the PEALD cycles includes a tetrakisdimethyl titanium (TDMAT) pulsing step and an N2 plasma step dissociating TDMAT pulsed in the TDMAT pulsing step; and
depositing a metal fill layer over the titanium nitride materials but not into a gap between adjacent two of the nanosheets.

11. The method of claim 10, wherein the titanium nitride materials are merged into a continuous structure during the PEALD process.

12. The method of claim 10, wherein the PEALD process is performed at a substrate temperature in a range from about 250° C. to about 450° C.

13. The method of claim 10, further comprising:
after performing the PEALD process, forming a conformal layer comprising titanium nitride wrapping around the titanium nitride materials.

14. The method of claim 13, wherein the conformal layer and the titanium nitride materials have an interface therebetween.

15. The method of claim 13, wherein the titanium nitride materials have a stoichiometry different from a stoichiometry of the conformal layer.

16. The method of claim 13, wherein a formation temperature of the conformal layer is different from a formation temperature of the titanium nitride materials.

17. The method of claim 13, wherein a formation temperature of the conformal layer is greater than a formation temperature of the titanium nitride materials.

18. A semiconductor device, comprising:
a plurality of nanosheets extending in a first direction above a semiconductor substrate and arranged in a second direction substantially perpendicular to the first direction; and
a gate structure extending in a third direction perpendicular to both the first and second directions, the gate structure surrounding each of the plurality of nanosheets, wherein the gate structure comprises:
a high-k gate dielectric layer surrounding each of the plurality of nanosheets;
a first titanium nitride layer over the high-k gate dielectric layer, wherein an atomic ratio of titanium to nitrogen of a portion of the first titanium nitride layer in contact with the high-k gate dielectric layer is less than 1 and greater than 0.6;
a second titanium nitride layer surrounding the first titanium nitride layer, the second titanium nitride layer has an atomic ratio of titanium to nitrogen greater than that of the first titanium nitride layer; and
a metal fill layer surrounding the second titanium nitride layer and absent between adjacent two of the plurality of nanosheets.

19. The semiconductor device of claim 18, wherein the atomic ratio of titanium to nitrogen of the second titanium nitride layer is about 1.

20. The semiconductor device of claim 18, wherein the second titanium nitride layer has a thickness less than a thickness of the first titanium nitride layer.

* * * * *